US012727137B2

(12) United States Patent
Kato et al.

(10) Patent No.: US 12,727,137 B2
(45) Date of Patent: Sep. 1, 2026

(54) COMPONENT MOUNTING DEVICE

(71) Applicant: Panasonic Intellectual Property Management Co., Ltd., Kadoma (JP)

(72) Inventors: Hiroaki Kato, Fukuoka (JP); Yoshinori Isobata, Fukuoka (JP); Yasuyuki Ishitani, Osaka (JP); Nobuyuki Kakishima, Yamanashi (JP); Ryota Inoue, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 594 days.

(21) Appl. No.: 18/261,118

(22) PCT Filed: Oct. 28, 2021

(86) PCT No.: PCT/JP2021/039816

§ 371 (c)(1),
(2) Date: Jul. 12, 2023

(87) PCT Pub. No.: WO2022/158077

PCT Pub. Date: Jul. 28, 2022

(65) Prior Publication Data

US 2024/0324160 A1 Sep. 26, 2024

(30) Foreign Application Priority Data

Jan. 21, 2021 (JP) ................................ 2021-007686

(51) Int. Cl.
*B23P 19/00* (2006.01)
*B65H 19/12* (2006.01)
(Continued)

(52) U.S. Cl.
CPC ......... *H05K 13/0419* (2018.08); *B65H 19/12* (2013.01); *H05K 13/021* (2013.01); *B65H 2701/1942* (2013.01)

(58) Field of Classification Search
CPC .. H05K 13/0419; H05K 13/021; B65H 19/12; B65H 2701/1942
See application file for complete search history.

(56) References Cited

U.S. PATENT DOCUMENTS 12,006,175 B2 * 6/2024 Isobata .................. B65H 49/20
12,466,681 B2 * 11/2025 Isobata ................ B65H 49/328
(Continued)

FOREIGN PATENT DOCUMENTS

JP 2007-299903 A 11/2007
JP 2019-176188 A 10/2019
(Continued)

OTHER PUBLICATIONS

English Translation of Chinese Search Report dated Jan. 21, 2026 for the related Chinese Patent Application No. 202180091381.7.
(Continued)

*Primary Examiner* — Paul D Kim
(74) *Attorney, Agent, or Firm* — McDonald Hopkins LLC

(57) ABSTRACT

A component mounting device of the present disclosure is provided with a tape feeder and a mounting head, the component mounting device including: housing cassette (22B) that stores a roll body of a carrier tape and allows the roll body to be taken in and out through an opening; and receiving cassette (22A) that houses roll body (RT) of carrier tape (CT) and allows roll body (RT) to be taken in and out through an opening, and that stores roll body (RT) supplied from housing cassette (22B) equipped on housing cassette attaching unit (39). The tape feeder draws carrier tape (CT) from roll body (RT) of receiving cassette (22A) equipped on receiving cassette attaching unit (38) to supply a component to the mounting head, and draws carrier tape (CT) from roll body (RT) of housing cassette (22B) equipped on housing (Continued)

cassette attaching unit (39) following carrier tape (CT) to supply the component to the mounting head.

9 Claims, 24 Drawing Sheets

(51) Int. Cl.
*H05K 13/02* (2006.01)
*H05K 13/04* (2006.01)

(56) References Cited

U.S. PATENT DOCUMENTS

| | | | | |
|---|---|---|---|---|
| 2017/0354070 | A1* | 12/2017 | Kobayashi | H05K 13/086 |
| 2020/0214182 | A1 | 7/2020 | Motowaki | |
| 2022/0162028 | A1 | 5/2022 | Isobata | |

FOREIGN PATENT DOCUMENTS

| | | | |
|---|---|---|---|
| JP | 2020-107680 | A | 7/2020 |
| WO | 2020/202737 | A1 | 10/2020 |

OTHER PUBLICATIONS

International Search Report issued in Patent Application No. PCT/JP2021/039816 dated Jan. 11, 2022.

* cited by examiner

REGION AR 44
44
43Z
43Z

D-D SECTION 43Z
43Z
44
44

E-E SECTION 55
54
42
(52)
41
44
44

F-F SECTION 44
44
42
41
43Z
43Z

G-G SECTION 53
45
43a
M1
RT
22
41
41K
41S
43b
42(52)
Z
Y
X 45
43a
41
42(52)
22
Z
N1
Y
X
RT
53
41K
43b 45
22
44
44
52
42
51
41
43(43Z)

45
22
44
44
52
42
41
51
43Z
43Z
43

45
SP
45
22
44
44
52
42
41
51
43Z
SP
43Z
43

COMPONENT MOUNTING DEVICE

TECHNICAL FIELD

The present disclosure relates to a component mounting device that picks up a component from a carrier tape housing the component and mounts the component on a board.

BACKGROUND ART

A tape feeder that conveys a carrier tape housing a component and supplies the component to a predetermined component supply port is conventionally known as a component supply unit used in a component mounting device for mounting a component on a board. The carrier tape is wound around a winding core of a reel as a tape holder, and transportation and storage of the carrier tape, setting to a tape feeder, and the like are performed while the carrier tape is wound around the reel.

There is also a proposal in which a carrier tape without a tape holder such as the reel and thus without a core is wound in a disc shape to form a roll body with which transportation, storage, setting on a tape feeder, and the like are performed (e.g., PTL 1 below). PTL 1 causes the roll body to be housed in a housing device in the shape of a partially opened case and enables the housing device having housed the roll body to be provided together with a tape feeder.

CITATION LIST

Patent Literature

PTL 1: WO 2020/202737 A

SUMMARY OF THE INVENTION

Unfortunately, PTL 1 described above causes the housing device of the roll body of the carrier tape (replenishment tape) for replenishment to be attached to the carriage at an end part of the housing device of the roll body of the carrier tape currently conveyed by the tape feeder (current tape feeder) in a cantilevered state. This structure is less likely to address increase in size of the roll body due to insufficient strength and insufficient rigidity of the housing device.

It is an object of the present disclosure to provide a component mounting device capable of addressing increase in size of a roll body.

A component mounting device according to the present disclosure is configured to pick up a component from a carrier tape housing the component and mount the component on a board, the component mounting device including: a mounting head that picks up the component and mounts the component on the board; a housing cassette including a first housing space for housing a roll body of the carrier tape, the housing cassette further including a first opening allowing the roll body to be taken in and out through the first opening, the first opening being provided in a front part of the housing cassette; a housing cassette attaching unit to which the housing cassette is equipped; a receiving cassette including a second housing space for housing the roll body of the carrier tape, the receiving cassette further including a second opening allowing the roll body to be taken in and out through the second opening, the receiving cassette housing the roll body supplied from the housing cassette equipped in the housing cassette attaching unit, the second opening being provided in a front part of the receiving cassette; a receiving cassette attaching unit to which the receiving cassette is equipped; and a component supply unit that draws the carrier tape from the roll body of the receiving cassette equipped in the receiving cassette attaching unit to supply the component to the mounting head and that draws the carrier tape from the roll body of the housing cassette equipped in the housing cassette attaching unit following the carrier tape.

The present disclosure enables addressing increase in size of the roll body easily.

BRIEF DESCRIPTION OF THE DRAWINGS

FIG. 16A is a sectional view of a tape cassette according to an exemplary embodiment of the present disclosure.

FIG. 16B is a sectional view of a tape cassette according to an exemplary embodiment of the present disclosure.

FIG. 16C is a sectional view of a tape cassette according to an exemplary embodiment of the present disclosure.

DESCRIPTION OF EMBODIMENT

Figure 1:
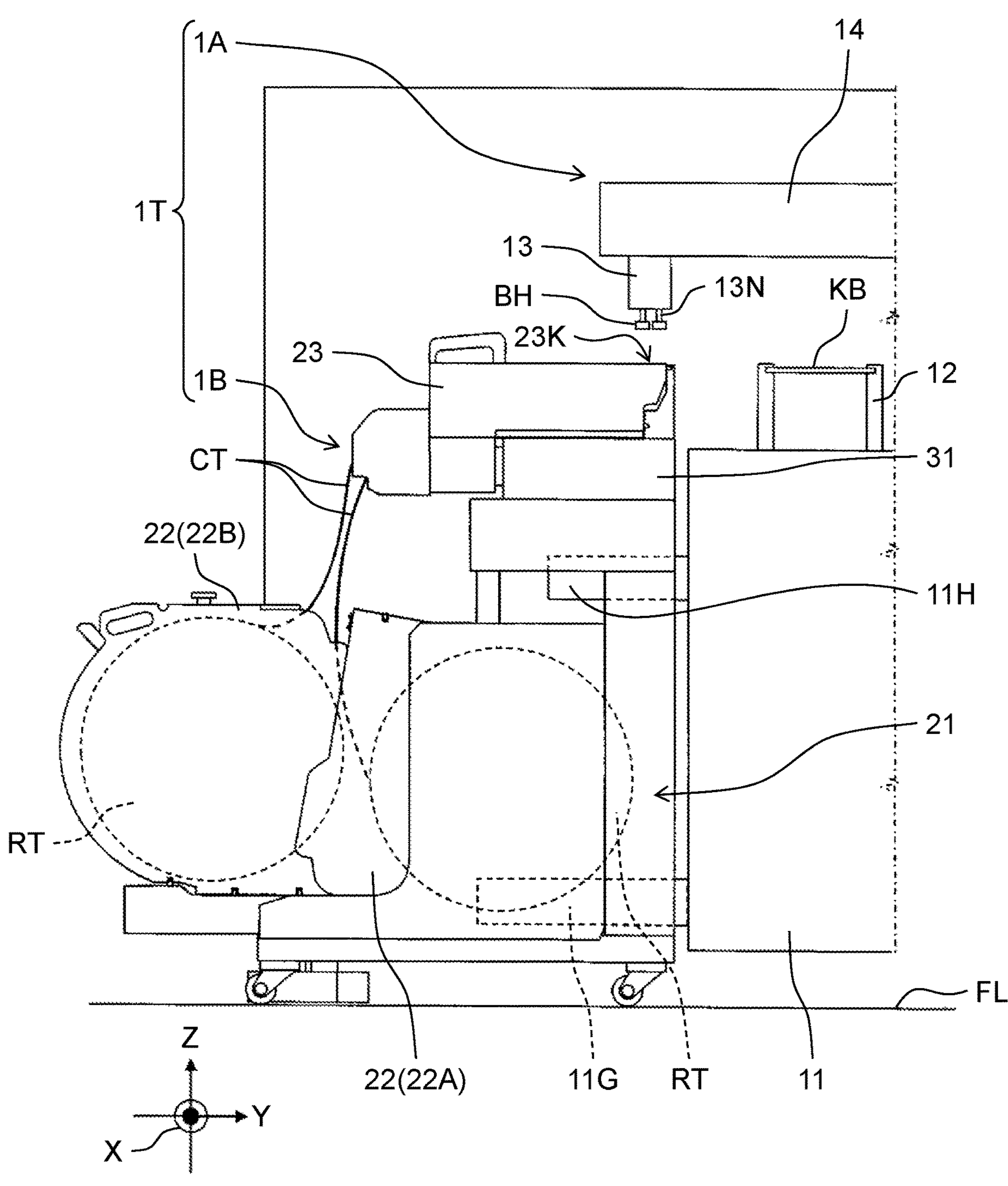
FIG. 1 is a side view of a main part of a component mounting device including a tape cassette according to an exemplary embodiment of the present disclosure.

Hereinafter, an exemplary embodiment of the present disclosure will be described with reference to the drawings. FIG. 1 is a side view of a main part of component mounting device 1T according to an exemplary embodiment of the present disclosure. Component mounting device 1T includes component mounting device body 1A and component supply part 1B to repeatedly perform a series of component mounting works of mounting component BH on board KB carried in from another device in an upstream process and carrying out component BH to another device in a downstream process.

FIG. 1 illustrates component mounting device body 1A that includes base 11, board conveyance unit 12, mounting head 13, and head moving mechanism 14. Board conveyance unit 12 includes a conveyor mechanism, and conveys board KB received from the device in the upstream process in a horizontal direction to position board KB at a predetermined work position. The present exemplary embodiment defines a conveying direction of board KB in component mounting device 1T as an X-direction (lateral direction), an up-down direction as a Z-direction, and a direction orthogonal to both the X-direction and the Z-direction as a Y-direction (front-back direction).

FIG. 1 illustrates mounting head 13 that includes multiple nozzles 13N extending downward to be able to generate vacuum suction force for sucking component BH to lower ends of respective nozzles 13N. Head moving mechanism 14 includes an XY table to move mounting head 13 in an XY plane, for example.

Figure 2:
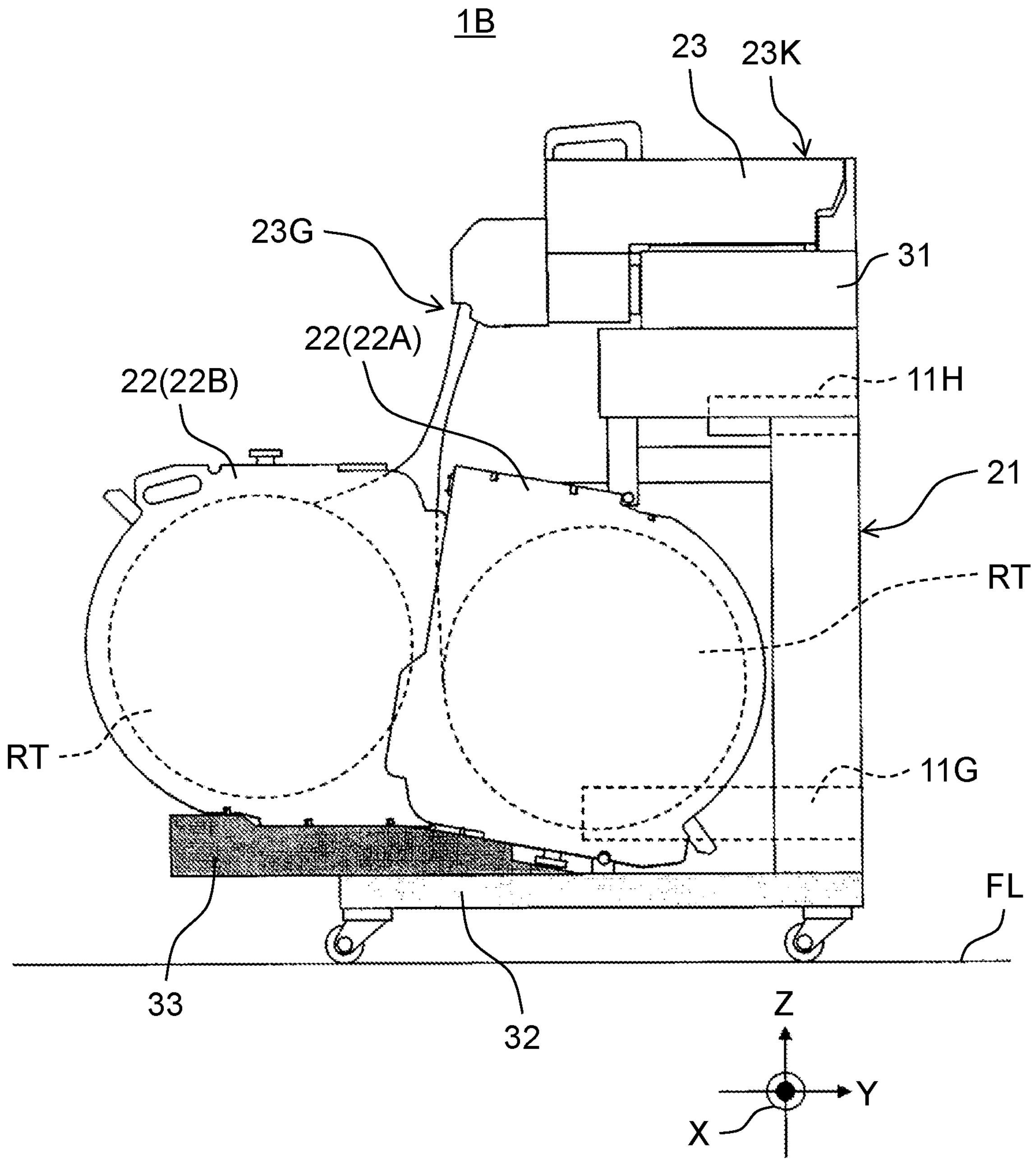
FIG. 2 is a side view of a component supply part of a component mounting device according to an exemplary embodiment of the present disclosure.
Figure 3:
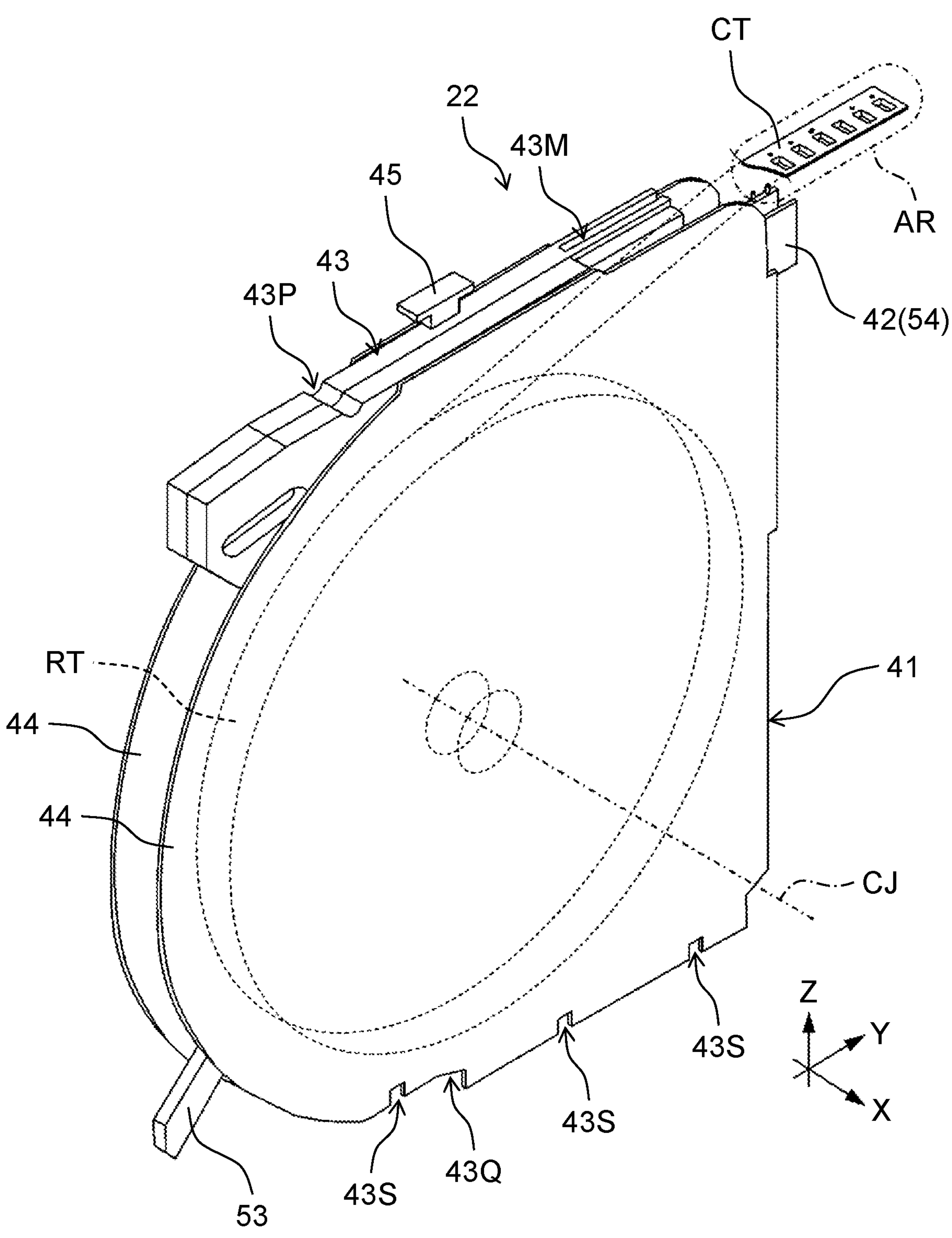
FIG. 3 is a perspective view illustrating a tape cassette provided in a component mounting device according to an exemplary embodiment of the present disclosure together with a roll body of a carrier tape housed in the tape cassette.
Figure 4:
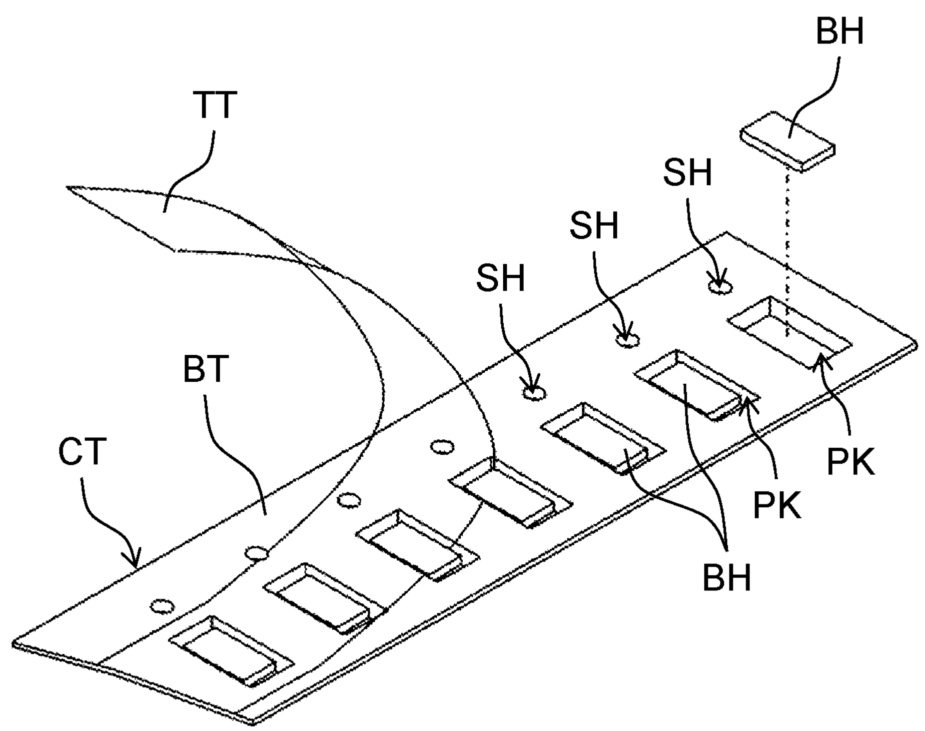
FIG. 4 is an enlarged perspective view of a part of a carrier tape drawn from a roll body used in a component mounting device according to an exemplary embodiment of the present disclosure.
Figure 5:
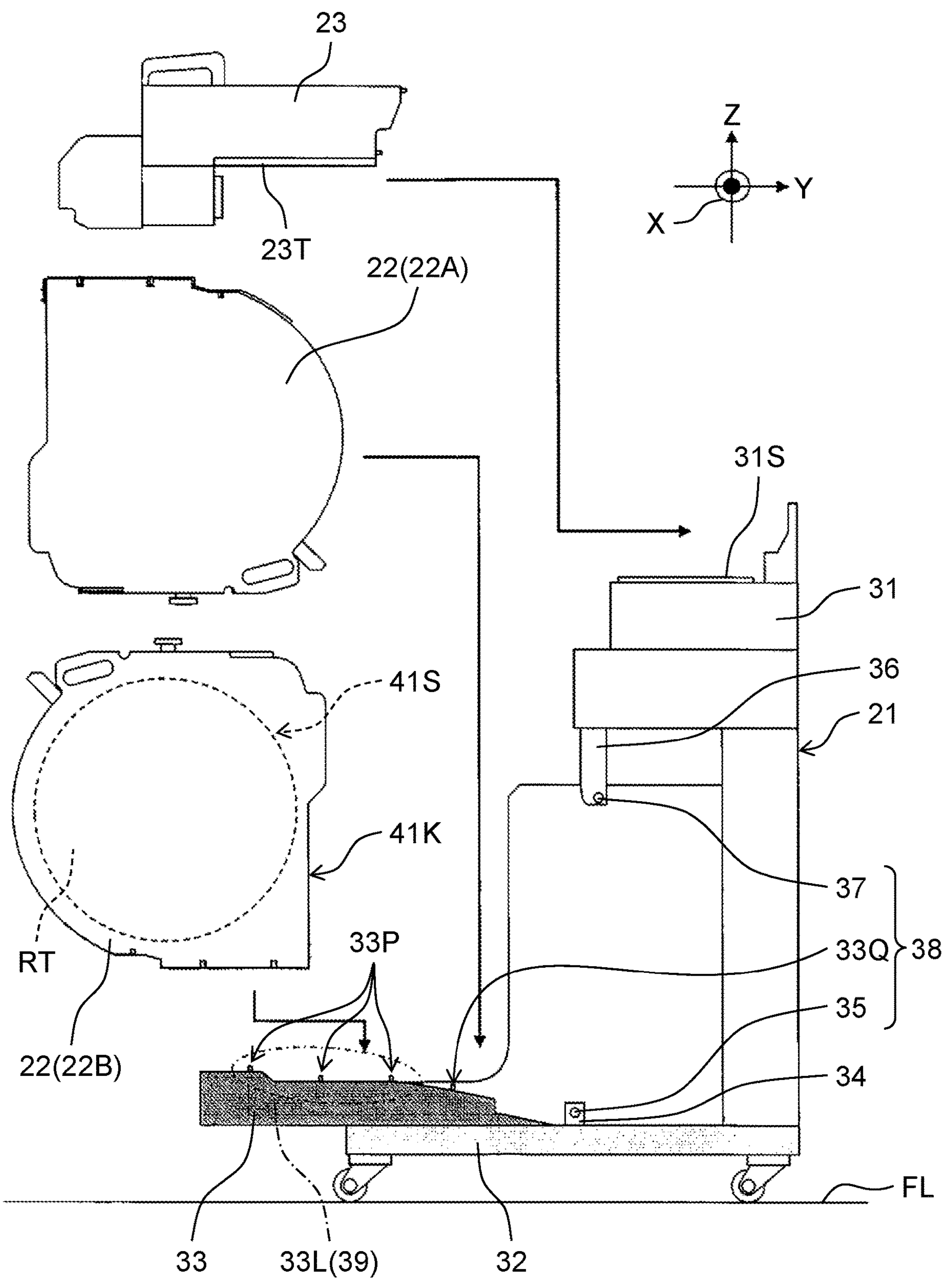
FIG. 5 is a side view illustrating components of a component supply part of a component mounting device according to an exemplary embodiment of the present disclosure.

FIG. 2 is a side view of component supply part 1B of component mounting device 1T. FIG. 3 is a perspective view illustrating tape cassette 22 provided in component mounting device 1T together with roll body RT of carrier tape CT housed in tape cassette 22. FIG. 4 is an enlarged perspective view of a part of carrier tape CT drawn from roll body RT used in component mounting device 1T. FIG. 5 is a side view illustrating components of component supply part 1B of component mounting device 1T. FIGS. 1 and 2 each illustrate component supply part 1B that includes carriage 21, tape cassette 22, and tape feeder 23. Tape cassette 22 is able to house roll body RT of carrier tape CT wound in a disk shape without a core, which is simply referred to below as roll body RT (see also FIG. 3). That is, tape cassette 22 is configured to handle roll body RT that is not wound around a reel.

As illustrated in FIG. 4 (FIG. 4 is an enlarged view of region AR in FIG. 3), carrier tape CT includes base tape BT and top tape TT. Base tape BT includes many pockets PK opened upward that are provided in a row and at equal intervals in a longitudinal direction of base tape BT. Each of pockets PK houses component BH. Top tape TT is attached to an upper surface of base tape BT to seal component BH in pocket PK. Multiple feed holes SH are provided in a row at equal intervals at respective positions aligned parallel to a row of pockets PK of base tape BT.

FIGS. 1 and 2 each illustrate base 11 that includes a pair of carriage guide parts 11G extending backward and disposed facing each other in the X-direction, and a pair of carriage holding units 11H similarly extending backward and disposed facing each other in the X-direction. The pair of carriage guide parts 11G is configured to guide both left and right side parts of a lower part of carriage 21 when carriage 21 is coupled to base 11. The pair of carriage holding units 11H is configured to lift and support both the left and right side parts of carriage 21 that is guided by carriage guide parts 11G and has approached base 11.

FIG. 5 illustrates feeder base 31 provided in an upper part of carriage 21. The feeder base 31 is provided on its upper surface with feeder attaching slot 31S that extends in the Y-direction to equip tape feeder 23. Tape feeder 23 functions as a component supply unit that supplies component BH to component mounting device body 1A, and can be attached to feeder base 31 by sliding slide protrusion 23T (FIG. 5) provided on a lower surface of tape feeder 23 into feeder attaching slot 31S of feeder base 31. The feeder base 31 is provided with multiple feeder attaching slots 31S disposed side by side in the X-direction. This structure enables multiple tape feeders 23 to be attached to feeder base 31 side by side in the X-direction.

FIGS. 1, 2, and 5 each illustrate carriage 21 includes cassette attaching unit 33 formed in a flat plate shape as a whole in a rear part (on the left in each of these drawings) of carriage base 32 movable on floor FL. As illustrated in FIG. 5, a pair of lower brackets 34 protruding and extending upward is provided facing each other in the X-direction in an intermediate part in the front-rear direction on carriage base 32. The pair of lower brackets 34 supports respective opposite ends of lower support bar 35 extending in the X-direction.

FIG. 5 illustrates feeder base 31 that is provided below with a pair of upper brackets 36 protruding and extending downward facing each other in the X-direction. The pair of upper brackets 36 supports respective opposite ends of upper support bar 37 extending in the X-direction. Upper support bar 37 extends parallel to lower support bar 35 at a position above lower support bar 35 (FIG. 5).

Figure 6:
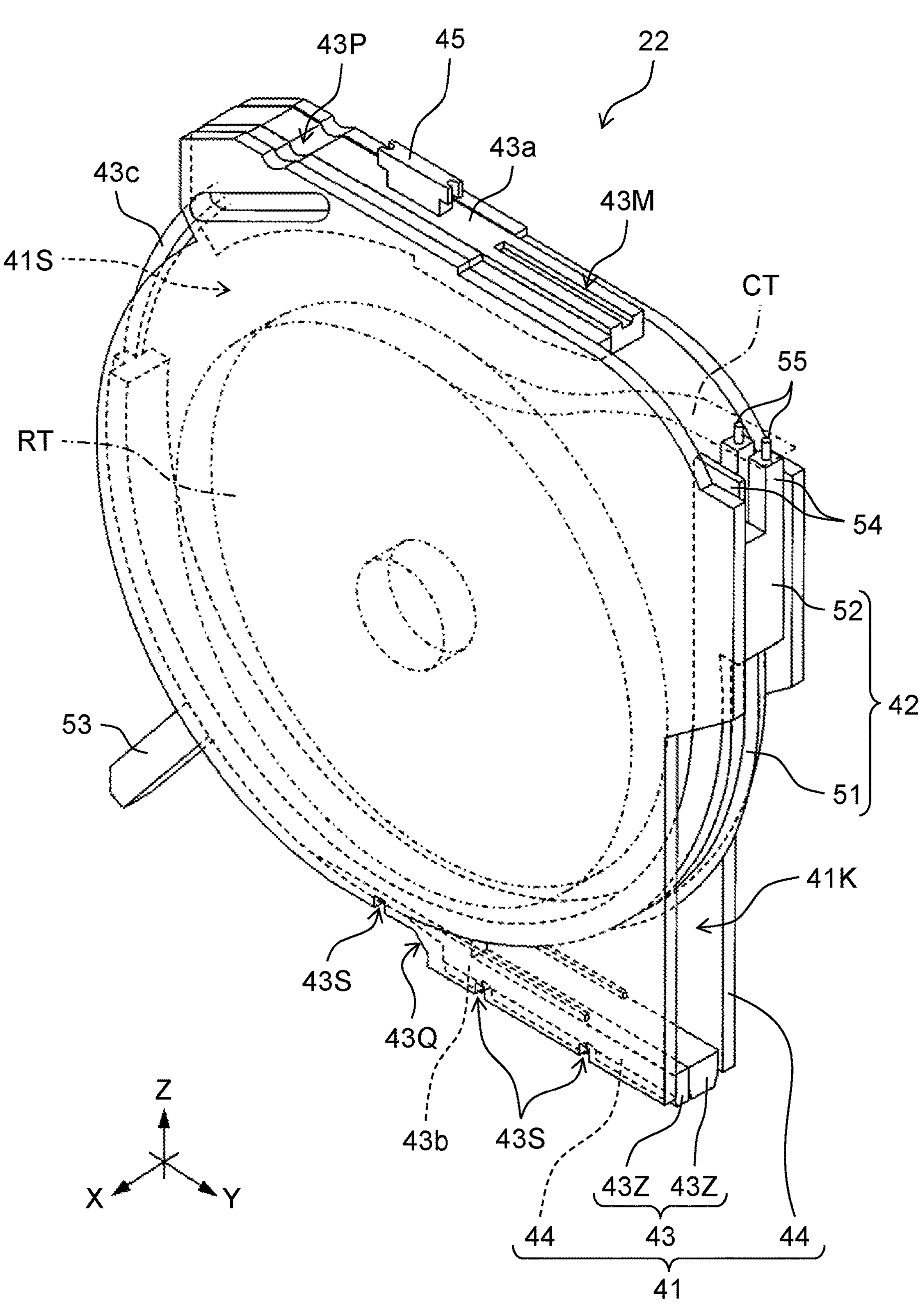
FIG. 6 is a perspective view of a tape cassette according to an exemplary embodiment of the present disclosure.

FIG. 6 is a perspective view of tape cassette 22. FIGS. 3 and 6 each illustrate tape cassette 22 that includes housing 41 in the shape of a case and shutter 42 as a restriction part provided in housing 41. Housing 41 of tape cassette 22 houses roll body RT in a longitudinal attitude. The term, "longitudinal attitude", refers to an attitude in which center axis line CJ of roll body RT in a disk shape is substantially horizontal.

Tape cassette 22 in the present exemplary embodiment is used in two types of usage. Tape cassette 22 is used in a first type of usage as a receiving part of roll body RT of carrier tape CT (current tape) currently conveyed by tape feeder 23, and is equipped across carriage base 32 and cassette attaching unit 33. Tape cassette 22 used as the receiving part of roll body RT of such a current tape is referred to below as "receiving cassette 22A" (FIGS. 2 and 5).

Tape cassette 22 is used in a second type of usage as a housing device that houses roll body RT of carrier tape CT (replenishment tape) for replenishment when the current tape runs out of components, and is attached to carriage base 32. Tape cassette 22 used as the housing device of roll body RT of such a current tape is referred to below as "housing cassette 22B" (FIGS. 2 and 5). As described above, receiving cassette 22A and housing cassette 22B are tape cassettes 22 identical in structure.

Each tape feeder 23 attached to feeder base 31 is a so-called automatic load feeder. When a head part of carrier tape CT is inserted from tape inlet 23G (FIG. 2) provided in a rear end part of tape feeder 23, carrier tape CT is conveyed forward when insertion of the head part is detected, thereby supplying component BH to predetermined component supply port 23K. At this time, tape feeder 23 conveys carrier tape CT while drawing carrier tape CT as a current tape from roll body RT in receiving cassette 22A.

The head part of carrier tape CT (replenishment tape) drawn from roll body RT in housing cassette 22B can be inserted into tape inlet 23G of tape feeder 23 before the current tape runs out of components. When detecting that a tail of the current tape has passed a predetermined position in tape feeder 23, tape feeder 23 starts conveyance of the replenishment tape. As a result, multiple carrier tapes CT are continuously conveyed without breaks, and component BH is supplied to component mounting device 1T without component shortage. Tape feeder 23 is a component supply unit that draws carrier tape CT from roll body RT of receiving cassette 22A to supply component BH to mounting head 13, and that draws carrier tape CT from roll body RT of housing cassette 22B following carrier tape CT from receiving cassette 22A to supply component BH to mounting head 13.

When component mounting device 1T performs component mounting operation, board conveyance unit 12 is first operated to carry in board KB from the outside and position board KB at a predetermined work position. After board conveyance unit 12 positions board KB at the work position, tape feeder 23 repeatedly performs a mounting turn by interlocking operation of supplying component BH to component supply port 23K with operation of moving mounting head 13 using head moving mechanism 14.

Mounting head 13 performs a series of operations of mounting component BH on board KB in one mounting turn by being moved to a position above tape feeder 23 to suck (pick up) component BH with nozzle 13N and then moved to a position above board KB to mount component BH. When all components BH to be mounted on board KB are mounted by repeatedly performing the mounting turn, board conveyance unit 12 is operated to carry out board KB to the device in the downstream process. As a result, the component mounting works per one board KB are completed.

Next, a configuration of tape cassette 22 used as receiving cassette 22A or housing cassette 22B of roll body RT of carrier tape CT and an attaching procedure on carriage 21 will be described.

Figure 7:
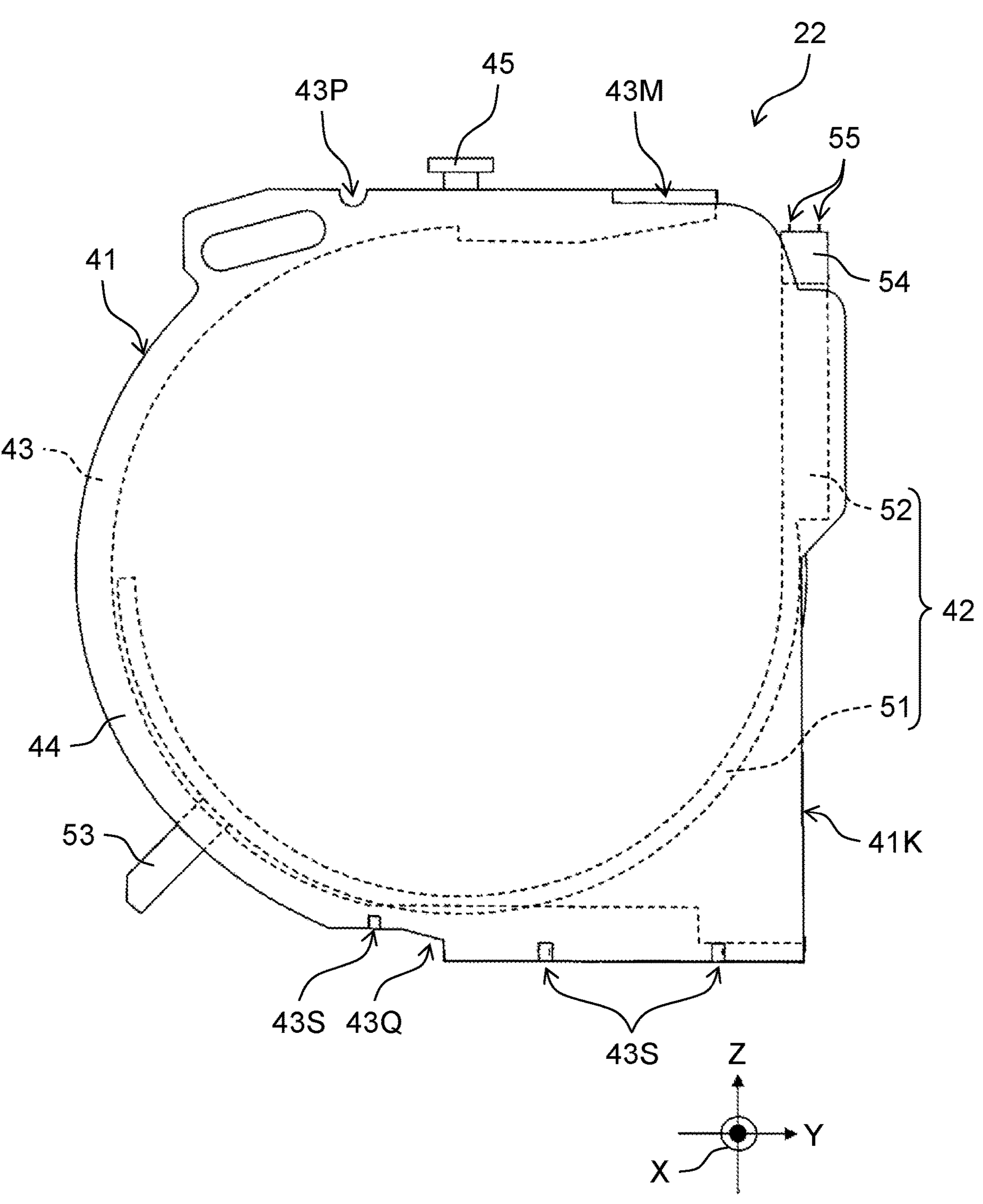
FIG. 7 is a side view of a tape cassette according to an exemplary embodiment of the present disclosure.
Figure 8:
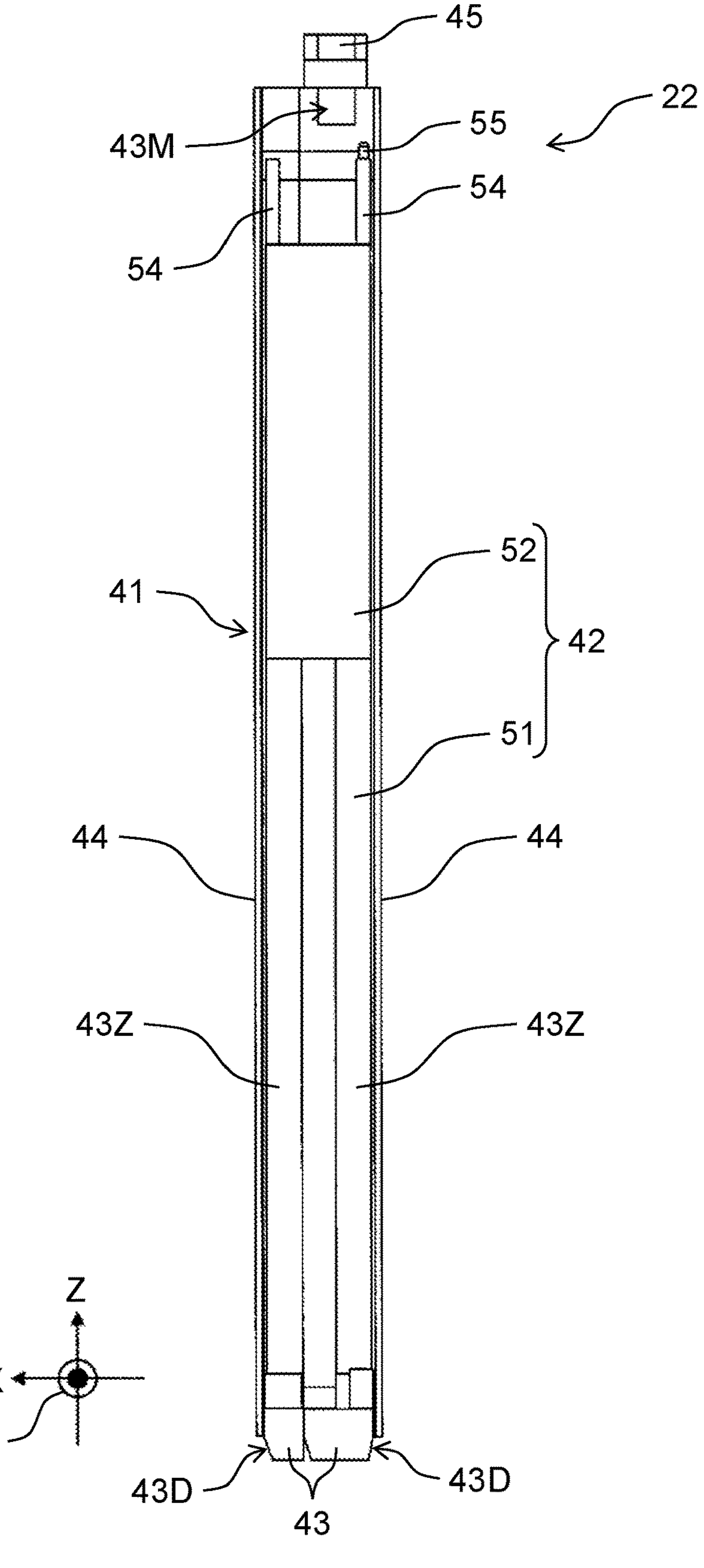
FIG. 8 is a front view of a tape cassette according to an exemplary embodiment of the present disclosure.
Figure 9:
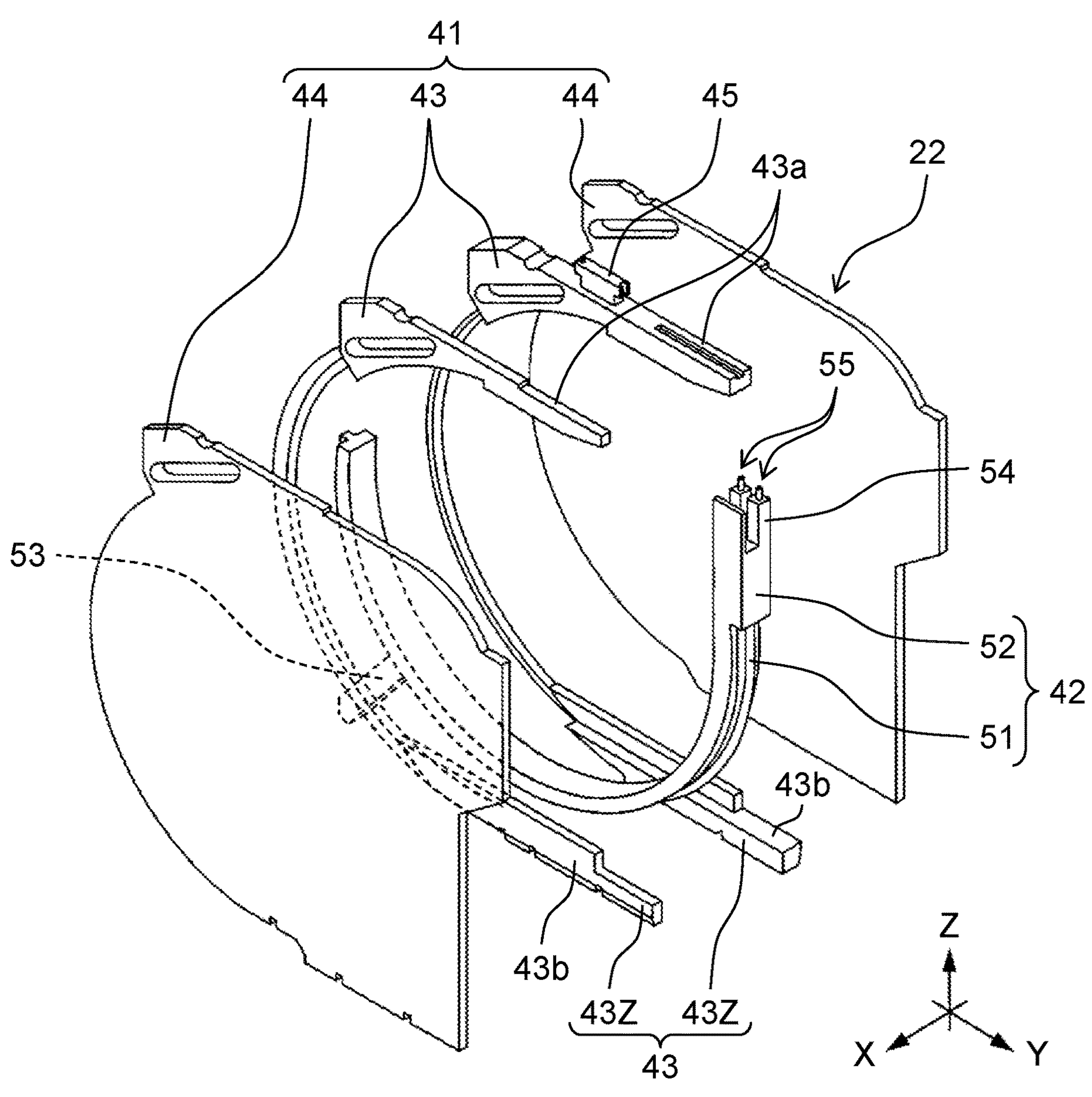
FIG. 9 is an exploded perspective view of a tape cassette according to an exemplary embodiment of the present disclosure.
Figure 10:
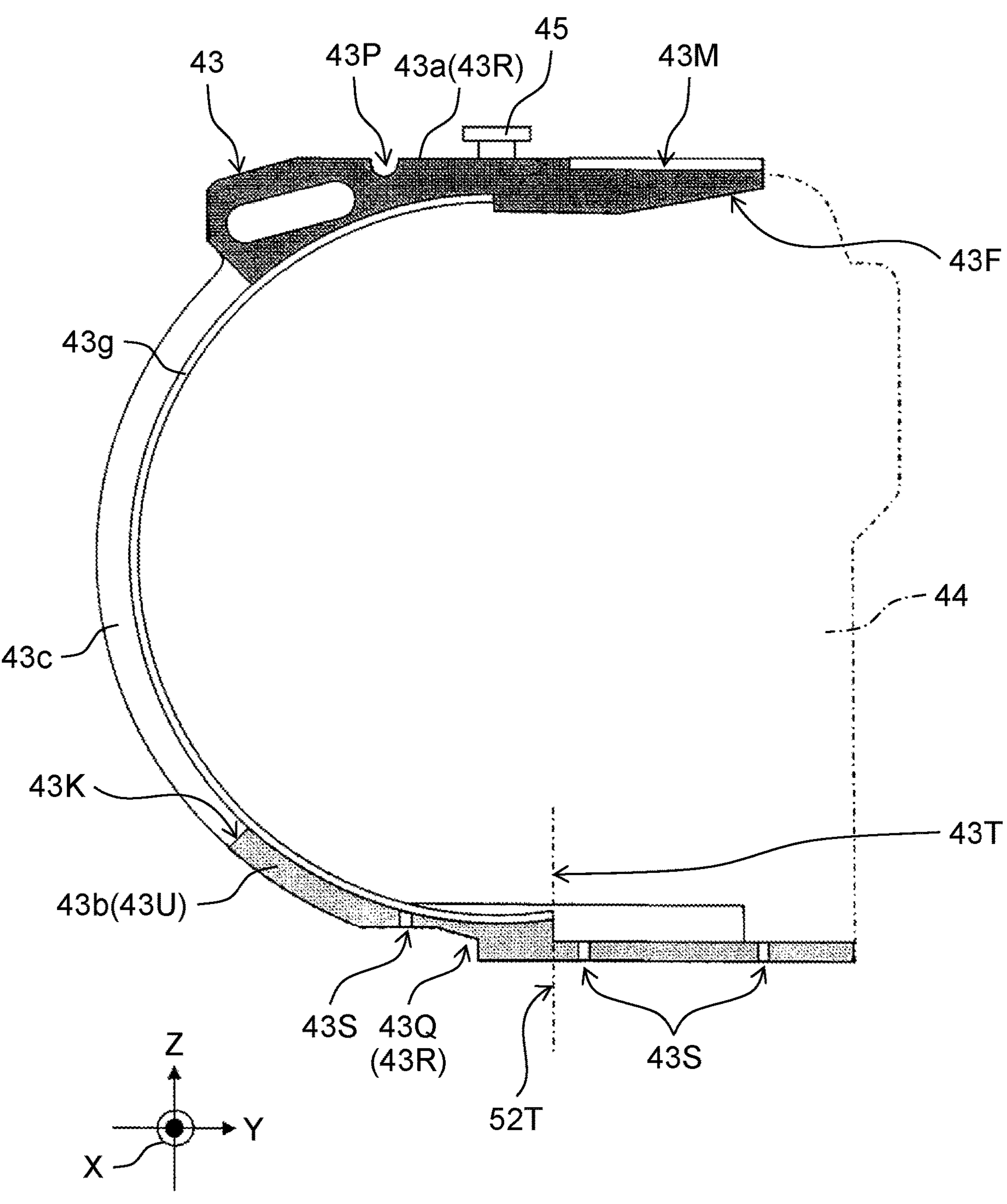
FIG. 10 is a side view of a frame provided in a tape cassette according to an exemplary embodiment of the present disclosure.

FIG. 7 is a side view of tape cassette 22. FIG. 8 is a front view of tape cassette 22. FIG. 9 is an exploded perspective view of tape cassette 22. FIG. 10 is a side view of frame 43 provided in tape cassette 22. FIGS. 6, 7, and 8 each illustrate tape cassette 22 that includes housing 41 and shutter 42 as a restriction part provided in housing 41. Housing 41 includes frame 43 in a U-shape and a pair of plate members (side plates 44) attached to respective sides of frame 43 in its width direction. Frame 43 in a U-shape and the pair of side plates 44 surround a space that is defined as housing space 41S for housing roll body RT. Frame 43 in a U-shape has an opening facing forward, so that front opening 41K as an opening is formed in a front part of housing 41.

As described above, housing 41 in the present exemplary embodiment includes frame 43 in a U-shape surrounding housing space 41S and the pair of side plates 44 (plate members) fixed to frame 43 and covering respective sides of housing space 41S. Housing 41 includes front opening 41K in the front part facing an outer peripheral surface of roll body RT.

FIGS. 6, 8, and 9 each illustrate frame 43 that includes two frame members 43Z disposed side by side in the width direction. As illustrated in FIGS. 9 and 10, frame 43 with the opening facing laterally has an upper part serving as frame upper part 43*a*, and a lower part serving as frame lower part 43*b*. Between frame upper part 43*a* and frame lower part 43*b*, guide part 43*c* in an arc shape is formed.

FIGS. 6 and 8 each illustrate a state where frame 43 is sandwiched between the pair of side plates 44, and frame upper part 43*a* of frame 43 is positioned facing an upper edge of side plate 44. Frame lower part 43*b* of frame 43 is positioned facing a lower edge of side plate 44. As illustrated in FIG. 10, guide part 43*c* has an inner peripheral surface provided with shutter guiding part 43*g* (guiding part) protruding toward the center of the arc of frame 43. Frame upper part 43*a* includes a front end part with a lower surface provided with guide surface 43F inclined upward toward the front.

FIGS. 6 and 10 each illustrate frame upper part 43*a* that is provided with engagement groove 43M, gripping part 45, and lower support bar engagement part 43P in this order from the front end part. Engagement groove 43M is provided facing an upper surface of frame upper part 43*a* and opens forward. Gripping part 45 is formed of a block-shaped member.

FIGS. 6 and 10 each illustrate frame lower part 43*b* that is provided with three pin insertion parts 43S side by side in the Y-direction. Additionally, upper support bar engagement part 43Q is formed in a region between two front pin insertion parts 43S and one rear pin insertion part 43S among three pin insertion parts 43S.

FIG. 5 illustrates cassette attaching unit 33 with an upper surface on which three housing cassette holding pins 33P are provided side by side in a row in the Y-direction. These three housing cassette holding pins 33P constitute one cassette holding pin row 33L. The upper surface of cassette attaching unit 33 is provided with multiple cassette holding pin rows 33L side by side in the X-direction.

FIG. 5 illustrates one receiving cassette holding pin 33Q that is provided in front of and coaxially with each of cassette holding pin rows 33L. That is, the upper surface of the cassette attaching unit 33 is provided with multiple pin rows disposed side by side in the X-direction, in each of which three housing cassette holding pins 33P (cassette holding pin rows 33L) and one receiving cassette holding pin 33Q are arranged in a row.

Figure 11:
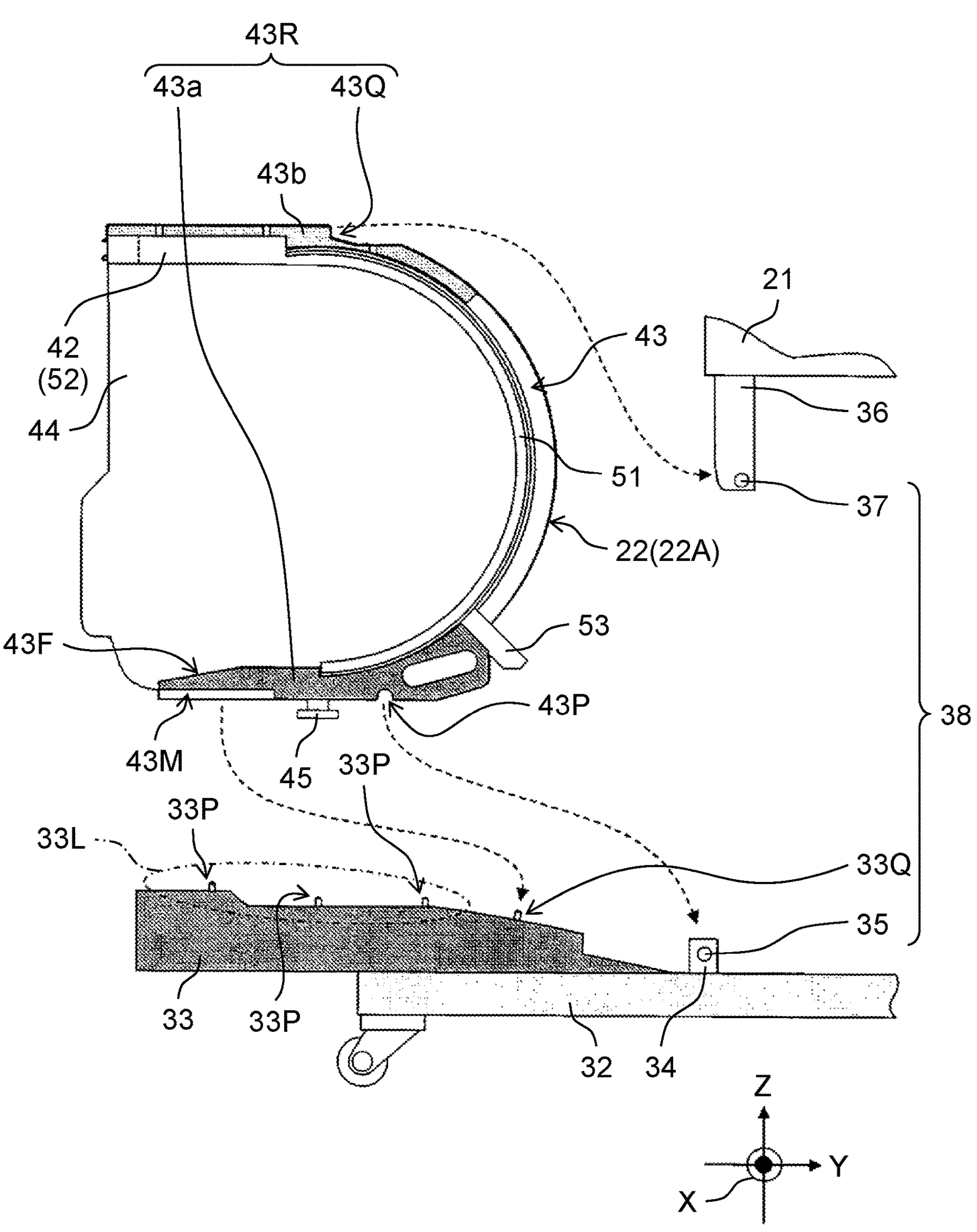
FIG. 11 is a side sectional view of a part of a component mounting device according to an exemplary embodiment of the present disclosure.
Figure 12:
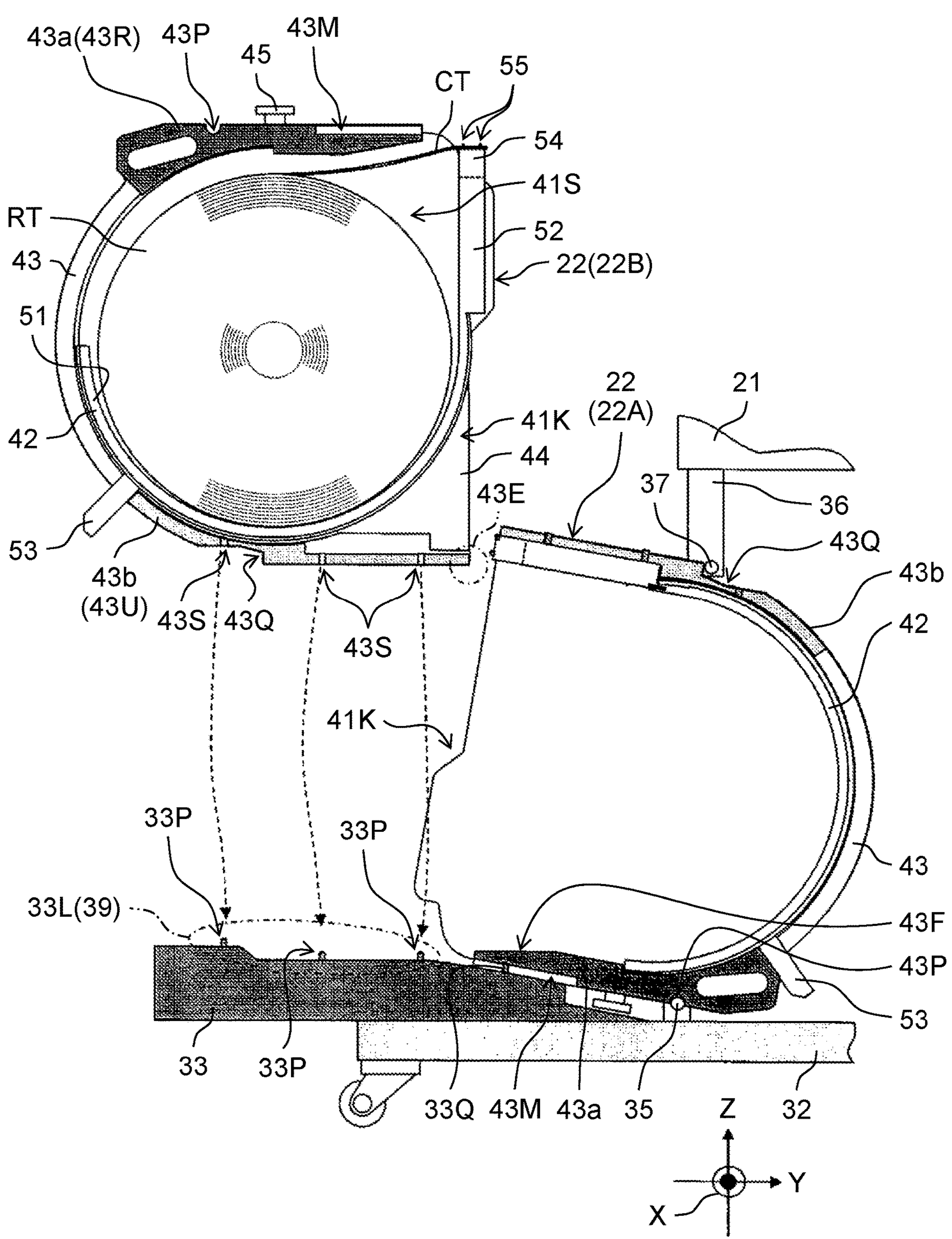
FIG. 12 is a side sectional view of a part of a component mounting device according to an exemplary embodiment of the present disclosure.

FIGS. 11 and 12 are each a side sectional view of a part of component mounting device 1T. As illustrated in FIGS. 2 and 12, receiving cassette 22A is attached to carriage 21 while being upside down, or being vertically inverted, with respect to housing cassette 22B. When receiving cassette 22A is attached to carriage 21, lower support bar engagement part 43P is engaged with lower support bar 35, upper support bar engagement part 43Q is engaged with upper support bar 37, and engagement groove 43M is engaged with receiving cassette holding pin 33Q, as illustrated in FIG. 11. As described above, one receiving cassette holding pin 33Q, lower support bar 35, and upper support bar 37 constitute receiving cassette attaching unit 38 (receiving unit attaching unit) to which receiving cassette 22A is attached in the present exemplary embodiment. Tape cassette 22 includes sub-attachment unit 43R formed of frame upper part 43*a* and upper support bar engagement part 43Q of frame lower part 43*b* (FIGS. 10 and 11). When sub-attachment unit 43R is attached to receiving cassette attaching unit 38, tape cassette 22 is attached to component mounting device 1T as receiving cassette 22A. In this manner, receiving cassette attaching unit 38 equips tape cassette 22 in a vertically inverted attitude.

As illustrated in FIG. 12, housing cassette 22B is equipped on carriage 21 such that three housing cassette holding pins 33P constituting one cassette holding pin row 33L are inserted into three respective pin insertion parts 43S provided in frame lower part 43*b*. As described above, cassette holding pin row 33L (three housing cassette holding pins 33P disposed in a row in the Y-direction) in the present embodiment serves as housing cassette attaching unit 39 (housing device attaching unit) to which housing cassette 22B is equipped. Tape cassette 22 includes main attachment part 43U (attachment part) formed of frame lower part 43*b* (FIGS. 10 and 12). When main attachment part 43U is equipped on housing cassette attaching unit 39, tape cassette 22 is equipped in component mounting device 1T as housing cassette 22B.

FIGS. 11 and 12 each illustrate receiving cassette 22A that is equipped using receiving cassette attaching unit 38 to cause front opening 41K of receiving cassette 22A to face housing cassette attaching unit 39. Then, housing cassette 22B is equipped using housing cassette attaching unit 39 to cause front opening 41K of housing cassette 22B to face receiving cassette 22A equipped on receiving cassette attaching unit 38. In this manner, receiving cassette 22A and housing cassette 22B are equipped on carriage 21 while front opening 41K of receiving cassette 22A and front opening 41K of housing cassette 22B face each other. Thus, roll body RT housed in housing cassette 22B can be moved to receiving cassette 22A.

Receiving cassette attaching unit 38 equips receiving cassette 22A at a position lower than that of housing cassette 22B equipped on housing cassette attaching unit 39. As a result, roll body RT is smoothly moved from housing cassette 22B to receiving cassette 22A, and roll body RT housed in receiving cassette 22A is prevented from moving to housing cassette 22B.

Then, receiving cassette attaching unit 38 equips receiving cassette 22A in an inclined attitude in which receiving cassette 22A decreases in height with distance from housing cassette attaching unit 39. As a result, roll body RT is smoothly moved from housing cassette 22B to receiving cassette 22A, and roll body RT housed in receiving cassette 22A is prevented from moving to housing cassette 22B.

Figure 13:
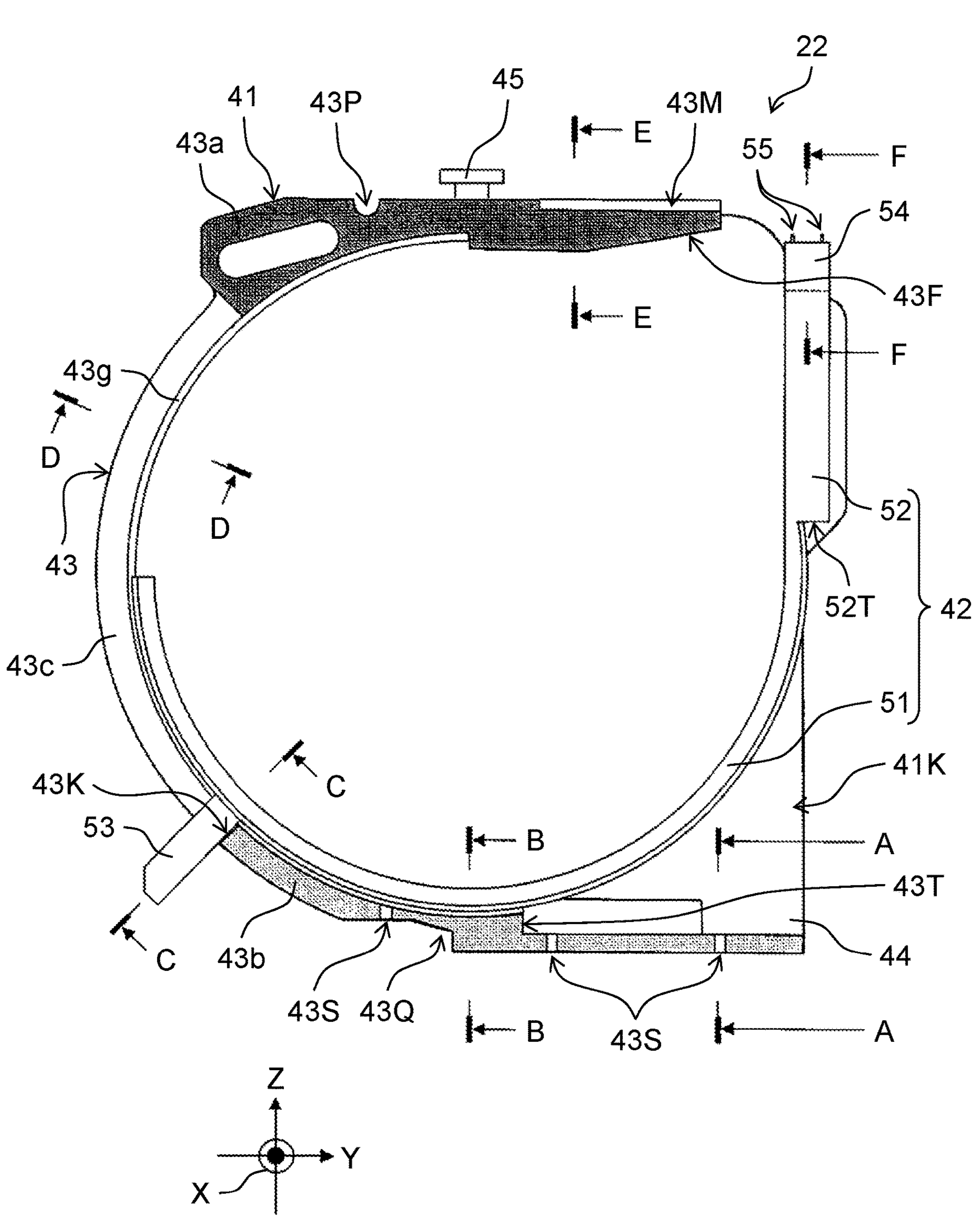
FIG. 13 is a side sectional view of a tape cassette according to an exemplary embodiment of the present disclosure.
Figure 14:
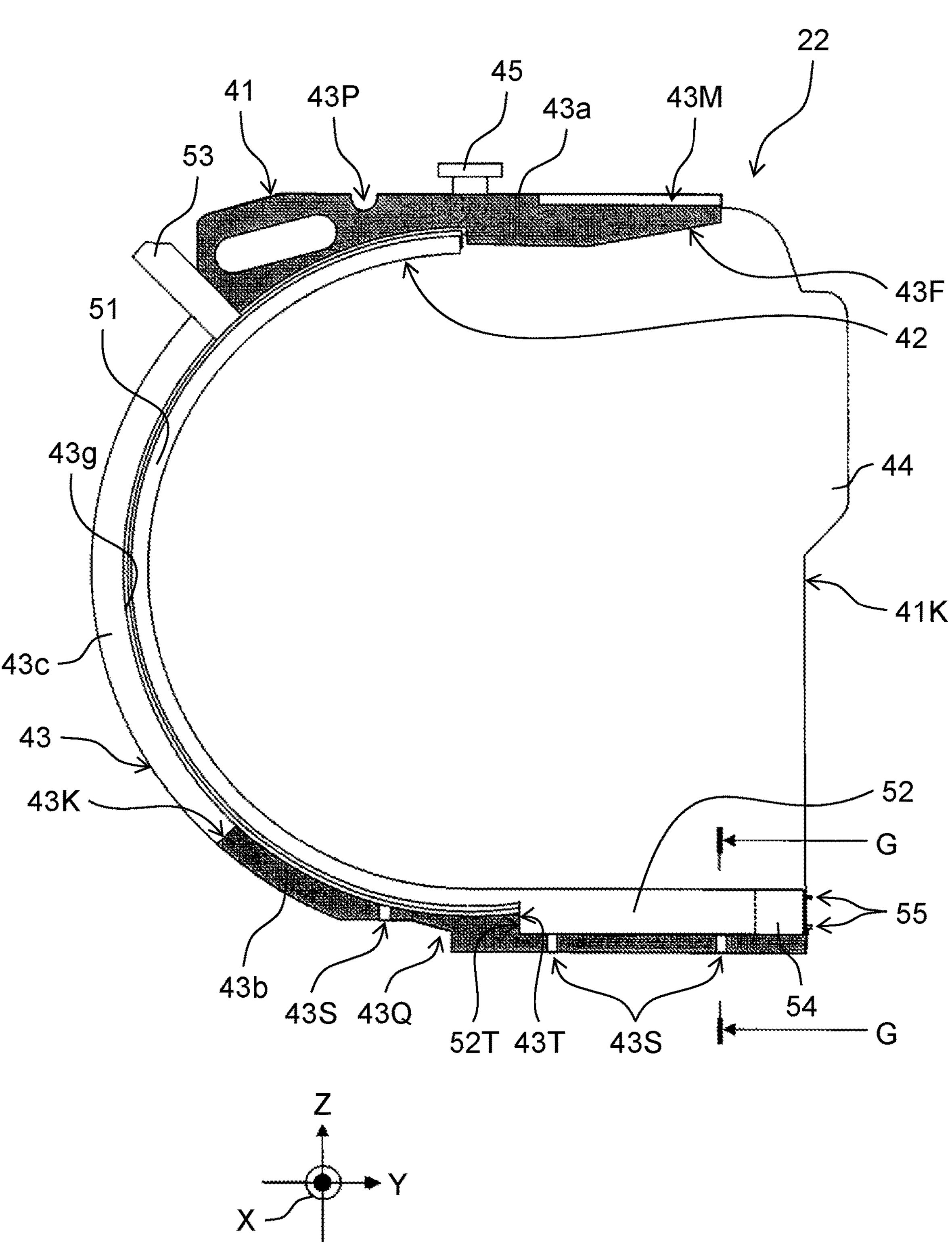
FIG. 14 is a side sectional view of a tape cassette according to an exemplary embodiment of the present disclosure.
Figure 15:
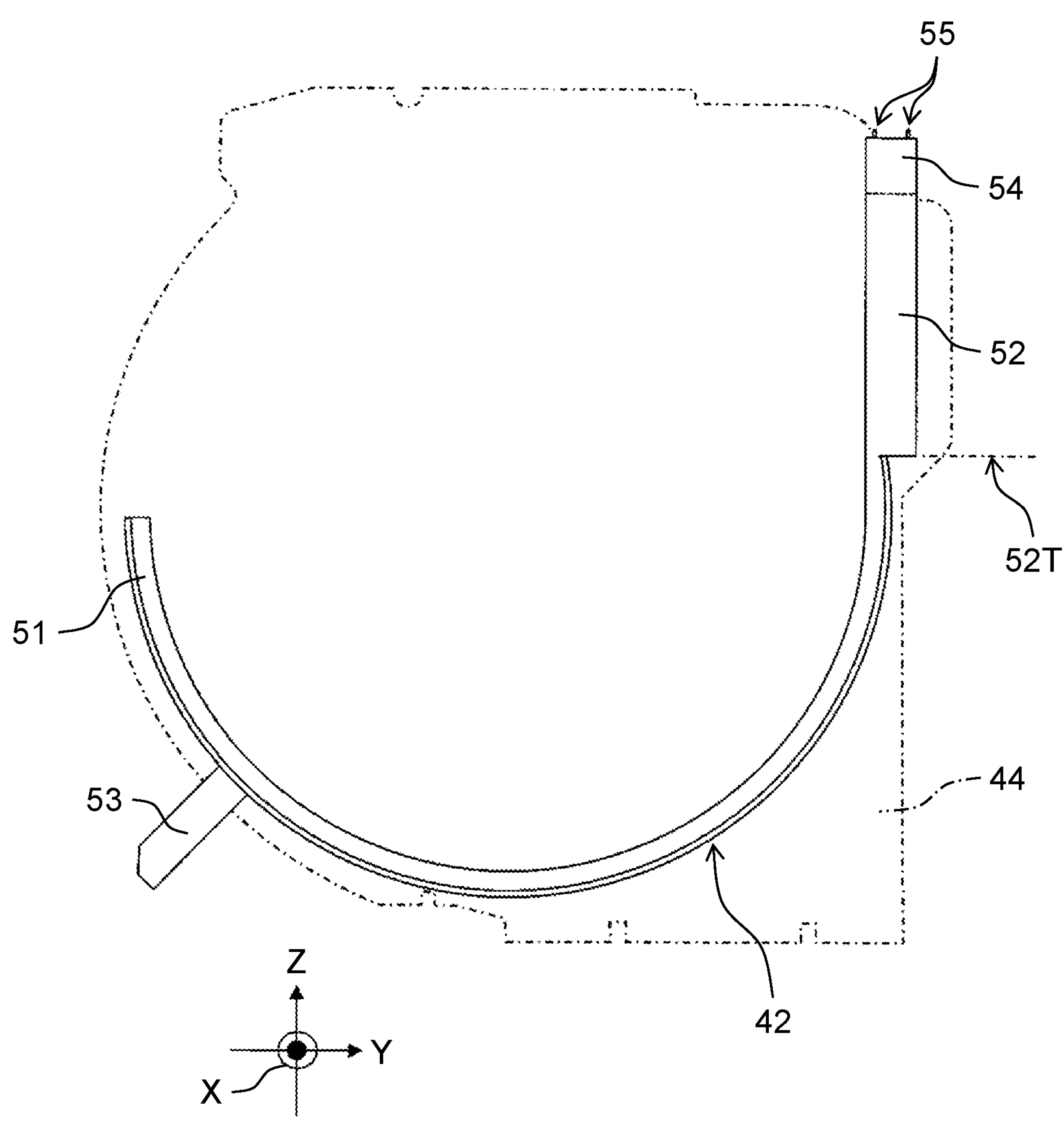
FIG. 15 is a side view of a shutter provided in a tape cassette according to an exemplary embodiment of the present disclosure.
Figures 16D, 16E, 16F, 16G:
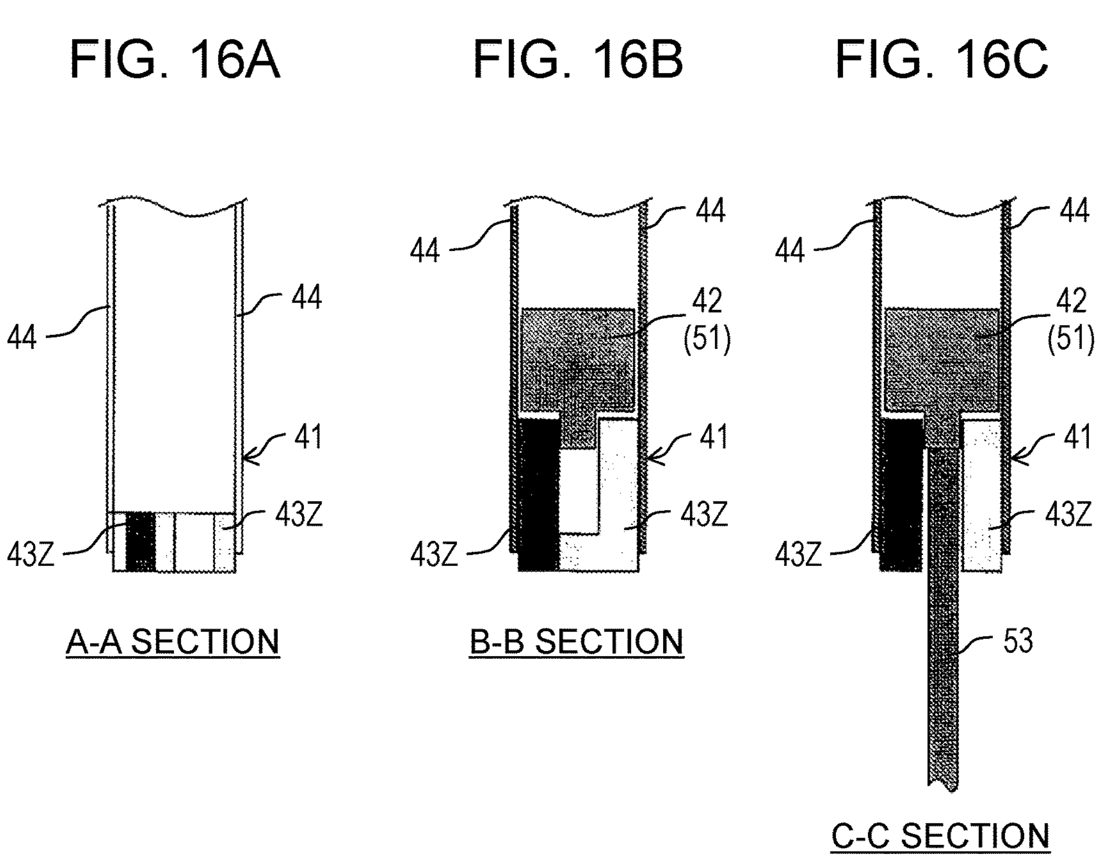
FIG. 16D is a sectional view of a tape cassette according to an exemplary embodiment of the present disclosure.
FIG. 16E is a sectional view of a tape cassette according to an exemplary embodiment of the present disclosure.
FIG. 16F is a sectional view of a tape cassette according to an exemplary embodiment of the present disclosure.
FIG. 16G is a sectional view of a tape cassette according to an exemplary embodiment of the present disclosure.

FIGS. 13 and 14 are each a side sectional view of tape cassette 22. FIG. 15 is a side view of shutter 42 provided in tape cassette 22. FIGS. 6, 13, and 14 each illustrate shutter 42 that is provided in housing space 41S of housing 41. As also illustrated in FIG. 15, shutter 42 has a J shape as a whole, and includes slider 51 in an arc shape and a shutter leading end part 52 linearly extending from one end of slider 51. Slider 51 in an arc shape is coupled to operation lever 53 that protrudes and extends outward from slider 51 (away from the center of the arc) and that is positioned protruding backward from housing 41.

FIGS. 6, 7, and 8 each illustrate tape holder 54 that is provided in a leading end part of shutter 42 (an end part of shutter leading end part 52). Tape holder 54 is a plate-shaped part extending in a direction in which shutter leading end part 52 extends. Tape holder 54 has a leading end part from which two tape locking protrusions 55 as feed hole engagement parts protrude and extend. The two tape locking protrusions 55 are provided side by side parallel to each other in a plane orthogonal to a width direction of housing 41.

Shutter 42 includes slider 51 in an arc shape with an outer peripheral surface that is guided by shutter guiding part 43*g* in an arc shape described above and provided in frame 43. When operation lever 53 is operated, shutter 42 is slid in a rotation direction having an axis parallel to the X-direction as a rotation axis in a region inside frame 43 by being guided by shutter guiding part 43*g*.

Shutter 42 has a closing position (first position) to close front opening 41K of housing 41 at a position where shutter leading end part 52 has an attitude extending in the up-down direction (Z-direction) in front of housing space 41S (FIG. 13). Shutter 42 also has an open position (second position) to open front opening 41K of housing 41 at a position where shutter leading end part 52 has an attitude extending in the front-back direction (Y-direction) in a lower part of housing space 41S (FIG. 14). When shutter 42 is positioned at the closing position, roll body RT in housing space 41S cannot be moved from housing 41 to the outside through front opening 41K. In contrast, when shutter 42 is positioned at the open position, roll body RT in housing space 41S can be moved outward from housing 41 through front opening 41K.

FIGS. 10, 13, and 14 each illustrate open-side stopper surface 43T that is formed at a front end of frame lower part 43*b*. At a boundary between slider 51 of shutter 42 and shutter leading end part 52, contact surface 52T as an end surface of shutter leading end part 52 is formed (FIG. 13). When operation lever 53 is moved from a lower position to an upper position, shutter 42 rotates clockwise in FIG. 13 (FIG. 13→FIG. 14), and is positioned at the closing position when contact surface 52T comes into contact with open-side stopper surface 43T (FIG. 14).

FIGS. 16A to 16F illustrate sections (A-A section, B-B section, C-C section, D-D section, E-E section, and F-F section illustrated in FIG. 13) of respective parts of tape cassette 22 with shutter 42 positioned at the closing position. FIG. 16G illustrates a section (G-G section in FIG. 14) of a part of tape cassette 22 with shutter 42 positioned at the open position.

FIGS. 10 and 14 each illustrate closed-side stopper surface 43K that is formed at an upper end (rear end) of frame lower part 43*b*. When operation lever 53 is moved from the upper position to the lower position, shutter 42 rotates counterclockwise in FIG. 14 (FIG. 14→FIG. 13), and is positioned at the closing position when operation lever 53 comes into contact with closed-side stopper surface 43K (FIG. 13). As described above, operation lever 53 in the present exemplary embodiment serves as an operation part that performs operation of displacing shutter 42 between the closing position (first position) and the open position (second position).

Figures 17A, 17B, 17C:
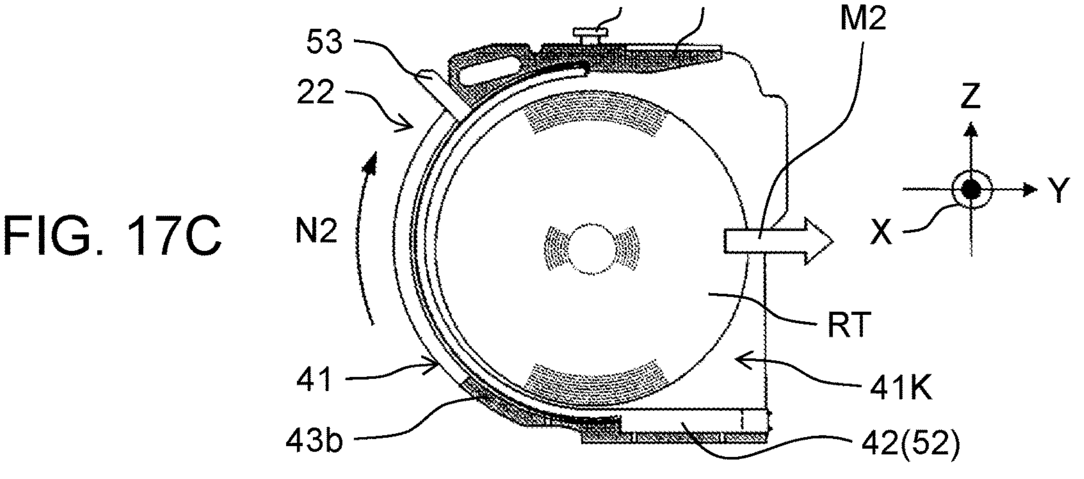
FIG. 17A is a side view of a tape cassette illustrating a state in which a roll body of a carrier tape is taken in and out of a housing cassette according to an exemplary embodiment of the present disclosure.
FIG. 17B is a side view of a tape cassette illustrating a state in which a roll body of a carrier tape is taken in and out of a housing cassette according to an exemplary embodiment of the present disclosure.
FIG. 17C is a side view of a tape cassette illustrating a state in which a roll body of a carrier tape is taken in and out of a housing cassette according to an exemplary embodiment of the present disclosure.

FIGS. 17A to 17C are each a side view of tape cassette 22 illustrating a state in which roll body RT of carrier tape CT is taken in and out of housing cassette 22B. When roll body RT is housed in tape cassette 22, roll body RT is inserted from front opening 41K of housing 41 with shutter 42 positioned at the open position (arrow M1 illustrated in FIG. 17A), and operation lever 53 is moved downward (arrow N1 illustrated in FIG. 17B). As a result, shutter 42 is moved from the open position to the closing position to close front opening 41K of housing 41 with shutter 42, and roll body RT is housed in tape cassette 22 (FIG. 17B).

In contrast, when roll body RT housed in tape cassette 22 is taken out, operation lever 53 is moved upward (arrow N2 illustrated in FIG. 17C). As a result, shutter 42 is moved from the closing position to the open position to open front opening 41K of housing 41, and roll body RT can be taken out from housing 41 (arrow M2 illustrated in FIG. 17C).

As described above, tape cassette 22 as the housing device in the present exemplary embodiment includes housing 41 having housing space 41S for housing roll body RT and the front opening 41K through which roll body RT can be taken in and out in the front part of housing 41, and shutter 42 as the restriction part that is displaced between the first position (closing position) at which movement of roll body RT housed in housing space 41S to the outside of housing 41 through front opening 41K is restricted by blocking at least a part of front opening 41K and the second position (open position) at which the movement of roll body RT housed in the housing space to the outside of housing 41 through front opening 41K is allowed. Shutter 42 includes shutter leading end part 52 that is positioned in front opening 41K when shutter 42 is displaced to the closing position and slider 51 that is slid while being guided by shutter guiding part 43*g* provided in frame 43.

Figures 18A, 18B, 18C:
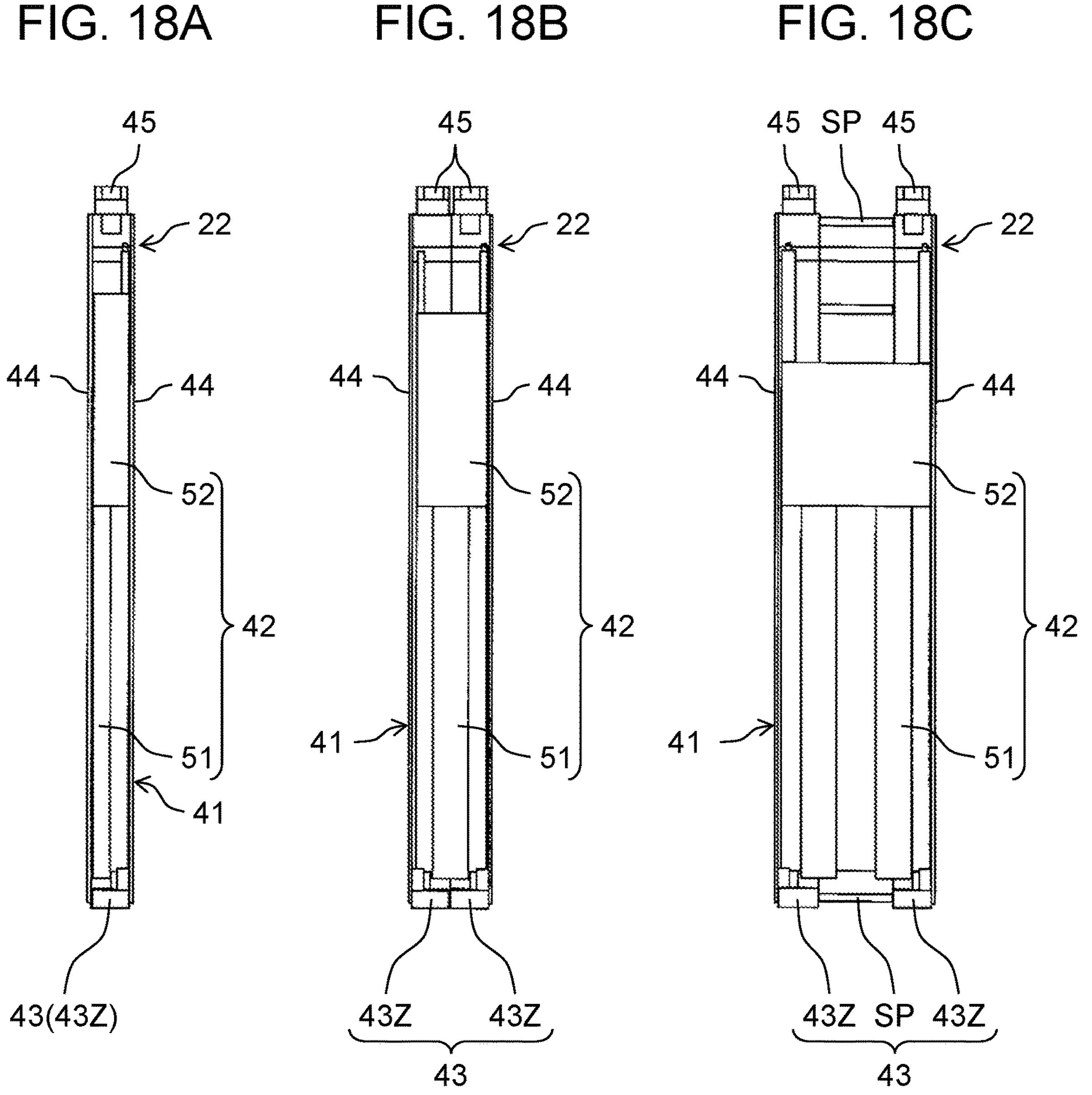
FIG. 18A is a front view of one of tape cassettes different in dimension in a width direction according to an exemplary embodiment of the present disclosure.
FIG. 18B is a front view of one of tape cassettes different in dimension in a width direction according to an exemplary embodiment of the present disclosure.
FIG. 18C is a front view of one of tape cassettes different in dimension in a width direction according to an exemplary embodiment of the present disclosure.
Figure 19:
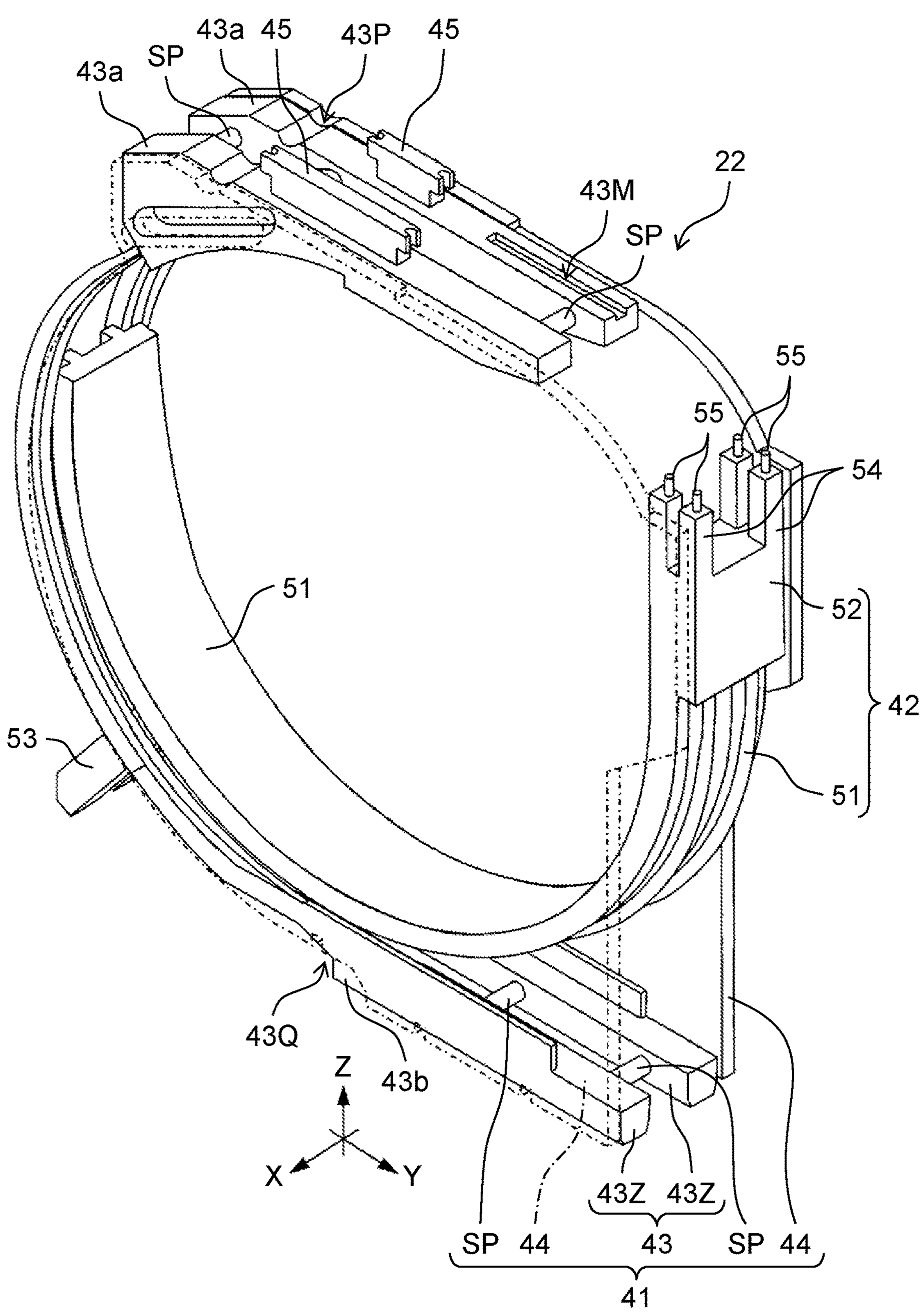
FIG. 19 is a perspective view of an example of a tape cassette having a largest dimension in the width direction according to an exemplary embodiment of the present disclosure.

Incidentally, multiple types of tape cassette 22 different in dimension in the width direction are required to address difference in dimension in the width direction of roll body RT. As described above, frame 43 includes two frame members 43Z (FIGS. 6 and 8). This structure allows one of frame members 43Z to have a thickness dimension corresponding to a dimension of roll body RT in the width direction, and the other to be commonly used regardless of difference in dimension of roll body RT in the width direction, thereby achieving commonality of members to enable the multiple types of tape cassettes 22 to be reduced in manufacturing cost. FIGS. 18A, 18B, and 18C are each a front view illustrating an example of multiple types of tape cassette 22 different in dimension in the width direction. FIG. 19 is a perspective view of an example of tape cassette 22 having the largest dimension in the width direction.

FIG. 18A illustrates structure formed of one of two frame members 43Z by removing the other to use the one in common, and the structure can address roll body RT (or carrier tape CT) having a smaller dimension in the width direction than that described above. FIG. 18B illustrates structure formed of two frame members 43Z one of which is increased in dimension in the width direction, and the structure can address roll body RT having a larger dimension in the width direction than that described above.

FIG. 18C illustrates structure formed of two frame members 43Z coupled to each other with spacer SP in a rod shape, and the structure can address roll body RT having a still larger dimension in the width direction than that in FIG. 18B (see also FIG. 19). Two frame members 43Z coupled to each other with spacer SP are configured to be commonly used. FIGS. 18B and 18C each illustrate gripping part 45 that is provided in each of two frame members 43Z. This is because, when gripping part 45 is gripped and tape cassette 22 is lifted, gripping part 45 provided on only one of two frame members 43Z causes tape cassette 22 to be inclined from a vertical attitude depending on a position of the center of gravity of the entire tape cassette, and thus causing difficulty in attachment work to carriage 21. This is also because, when one gripping part 45 is gripped to try to forcibly bring tape cassette 22 into the vertical attitude, an excessive bending moment may act on gripping part 45 to damage gripping part 45.

Next, a procedure for attaching tape cassette 22 to component supply part 1B provided in component mounting device 1T will be described. To attach tape cassette 22 to component supply part 1B, receiving cassette 22A is first equipped to receiving cassette attaching unit 38, which is a receiving unit attaching unit, of carriage 21.

When equipping receiving cassette 22A to the receiving cassette attaching unit 38, an operator first positions shutter 42 at the open position (second position) with operation lever 53 and then turns tape cassette 22 upside down. Then, the operator performs operations of: engaging lower support bar engagement part 43P provided in frame upper part 43*a* with lower support bar 35; engaging upper support bar engagement part 43Q provided in frame lower part 43*b* with upper support bar 37; and engaging engagement groove 43M provided in frame upper part 43*a* with receiving cassette holding pin 33Q (FIG. 11→FIG. 12). Receiving cassette 22A equipped to carriage 21 has an inclined attitude in which tape cassette 22 is slightly lowered forward, and guide surface 43F provided on frame upper part 43*a* is in a substantially horizontal attitude (FIG. 12). Then, shutter 42 of receiving cassette 22A equipped to carriage 21 is positioned at the open position (second position).

After receiving cassette 22A is equipped on receiving cassette attaching unit 38 of carriage 21 as described above, housing cassette 22B housing roll body RT is equipped on housing cassette attaching unit 39 of carriage 21. Shutter 42 of housing cassette 22B is positioned at the closing position until immediately before housing cassette 22B is equipped to housing cassette attaching unit 39, and the head part of carrier tape CT drawn from roll body RT is held by tape holder 54 of shutter 42 positioned at the closing position (FIG. 12).

Here, the head part of carrier tape CT is held by tape holder 54 in such a manner that two tape locking protrusions 55 provided on tape holder 54 are locked to two of multiple feed holes SH provided on the head part of carrier tape CT drawn out from roll body RT from below (FIGS. 6 and 12). In this state, the head part of carrier tape CT is in a substantially horizontal attitude.

As described above, tape holder 54 provided at the leading end part (shutter leading end part 52) of shutter 42 in the present exemplary embodiment includes two tape locking protrusions 55 as the feed hole engagement parts engageable with corresponding feed holes SH of carrier tape CT. These tape locking protrusions 55 are configured to hold carrier tape CT drawn out from roll body RT. At this time, the head part of carrier tape CT is in a horizontal attitude. That is, when shutter 42 is positioned (displaced) at the closing position (first position), the tape holder 54 horizontally holds carrier tape CT.

When attaching housing cassette 22B to housing cassette attaching unit 39, the operator grips gripping part 45 provided on frame upper part 43*a* of frame 43 (grips two gripping parts 45 when two gripping parts 45 are provided) and then lifts housing cassette 22B. Then, the operator pinches the head part of carrier tape CT held by tape holder 54 with fingers and inserts the head part into tape inlet 23G at the rear end part of tape feeder 23.

When insertion of the head part of carrier tape CT into tape inlet 23G is detected, tape feeder 23 into which carrier tape CT has been inserted starts drawing carrier tape CT. When tape feeder 23 starts drawing carrier tape CT, the operator moves operation lever 53 upward to move shutter 42 from the closing position to the open position, thereby opening front opening 41K of housing cassette 22B.

Figure 20A:
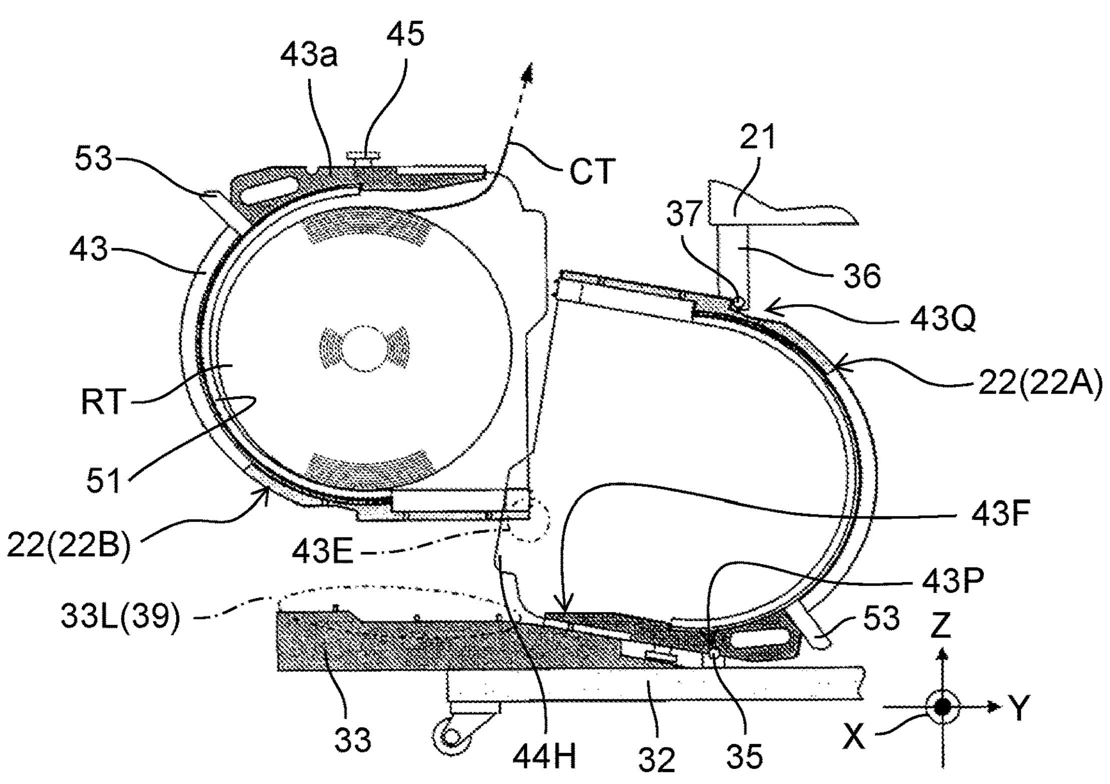
FIG. 20A is a side sectional view of a part of a component mounting device and illustrates a procedure for attaching a tape cassette according to an exemplary embodiment of the present disclosure.
Figure 20B:
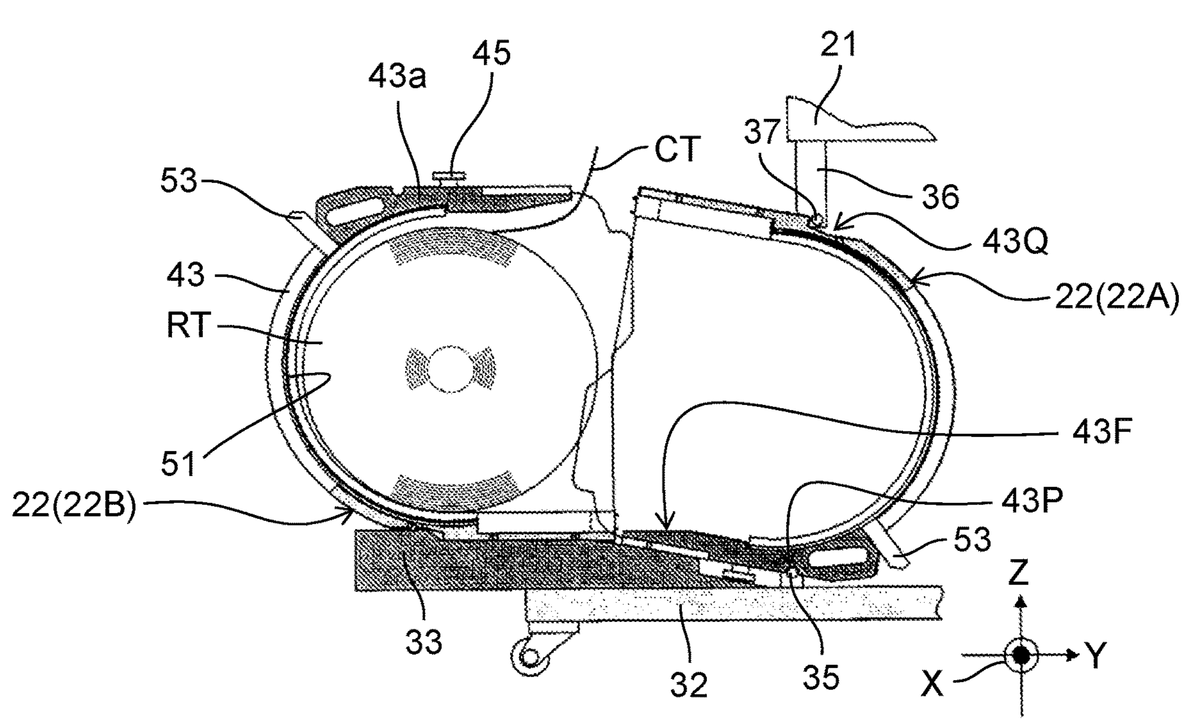
FIG. 20B is a side sectional view of a part of a component mounting device and illustrates a procedure for attaching a tape cassette according to an exemplary embodiment of the present disclosure.

FIGS. 20A and 20B are each a side sectional view of a part of component mounting device 1T, illustrating a procedure of attaching tape cassette 22. After inserting the head part of carrier tape CT drawn from roll body RT into tape inlet 23G of tape feeder 23, the operator operates operation lever 53 to position shutter 42 at the open position. After this operation causes front opening 41K of housing cassette 22B to be opened, housing cassette 22B is moved to above housing cassette attaching unit 39 (FIG. 20A). Then, housing cassette 22B is lowered to insert three housing cassette holding pins 33P constituting cassette holding pin row 33L and serving as housing cassette attaching unit 39 into three corresponding pin insertion parts 43S provided in frame lower part 43*b* of housing cassette 22B, thereby equipping housing cassette 22B to housing cassette attaching unit 39, or to carriage 21 (FIG. 20B).

When equipping housing cassette 22B to housing cassette attaching unit 39, the operator causes front end 43E of the lower part (frame lower part 43*b*) of housing cassette 22B to pass through between a pair of bulging-out parts 44H of receiving cassette 22A equipped to receiving cassette attaching unit 38 (FIG. 20A→FIG. 20B). As illustrated in FIG. 8, frame lower part 43*b* has a lower end formed as tapered surface 43D having a shape (shape narrowing downward) that allows frame lower part 43*b* to be easily guided between the pair of bulging-out parts 44H.

When housing cassette 22B is equipped to housing cassette attaching unit 39 as described above (so that front end 43E of the lower part passes through between the pair of bulging-out parts 44H of receiving cassette 22A), the pair of side plates 44 of housing cassette 22B is positioned inside the pair of side plates 44 of receiving cassette 22A (FIG. 20B). Thus, housing cassette 22B is sandwiched between the pair of side plates 44 of receiving cassette 22A positioned in front of housing cassette 22B to suppress movement of housing cassette 22B in the X-direction (a direction of lateral falling), and thus is stabilized in attitude on carriage 21.

Then, front opening 41K of housing cassette 22B is at least partly inserted into front opening 41K of receiving cassette 22A. In other words, housing cassette attaching unit 39 equips housing cassette 22B while allowing front opening 41K of housing cassette 22B to be at least partly inserted into front opening 41K of receiving cassette 22A. As a result, side plates 44 of housing cassette 22B are positioned inside corresponding side plates 44 of receiving cassette 22A, and thus enabling preventing a trouble in which roll body RT moving from housing cassette 22B to receiving cassette 22A is caught on edges of side plates 44.

As described above, housing 41 of tape cassette 22 (housing cassette 22B) in the present exemplary embodiment includes pin insertion part 43S serving as an engaged part engageable with cassette holding pin row 33L (three housing cassette holding pins 33P) serving as a positioning part of carriage 21 or component mounting device 1T. Then, housing cassette 22B is positioned and held by housing cassette attaching unit 39 including cassette holding pin row 33L (three housing cassette holding pins 33P). Thus, movement of housing cassette 22B in the X-direction (the direction of lateral falling) is suppressed due to housing cassette 22B held by housing cassette attaching unit 39 and sandwiched between the pair of side plates 44 of receiving cassette 22A positioned in front of housing cassette 22B.

Figure 21A:
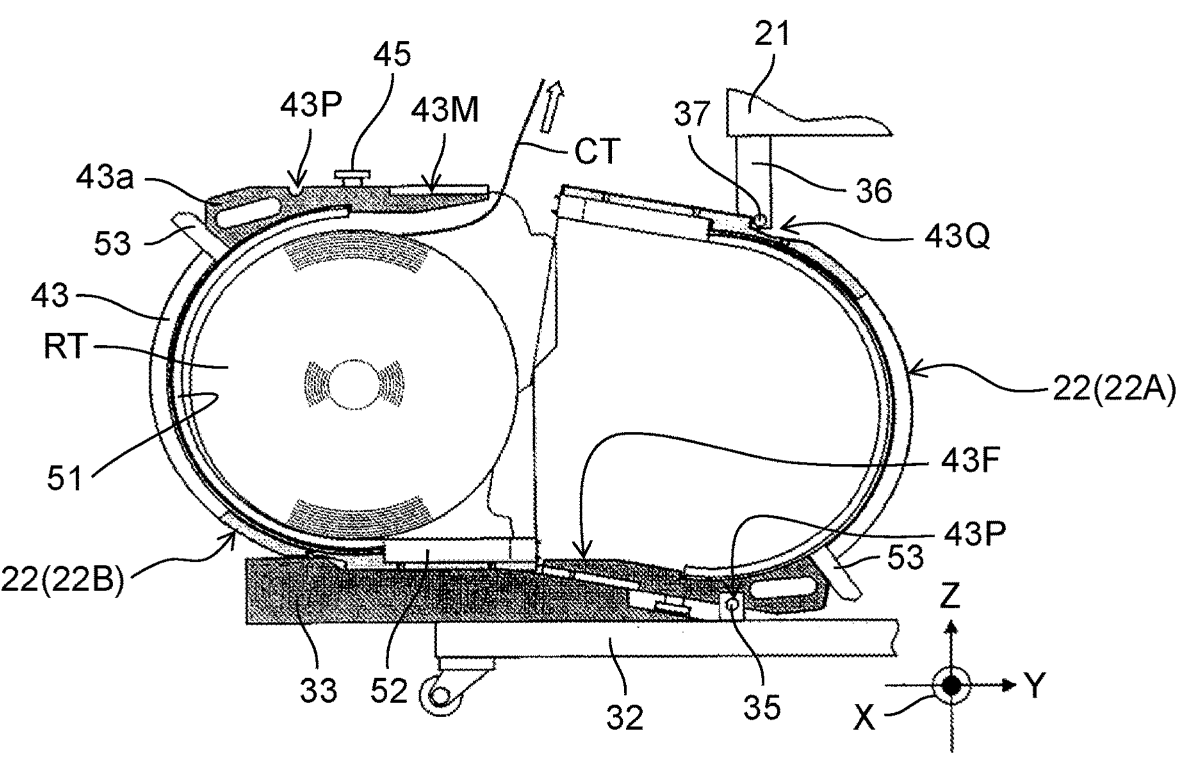
FIG. 21A is a side sectional view of a part of a component mounting device and illustrates a state of movement of a roll body according to an exemplary embodiment of the present disclosure.
Figure 21B:
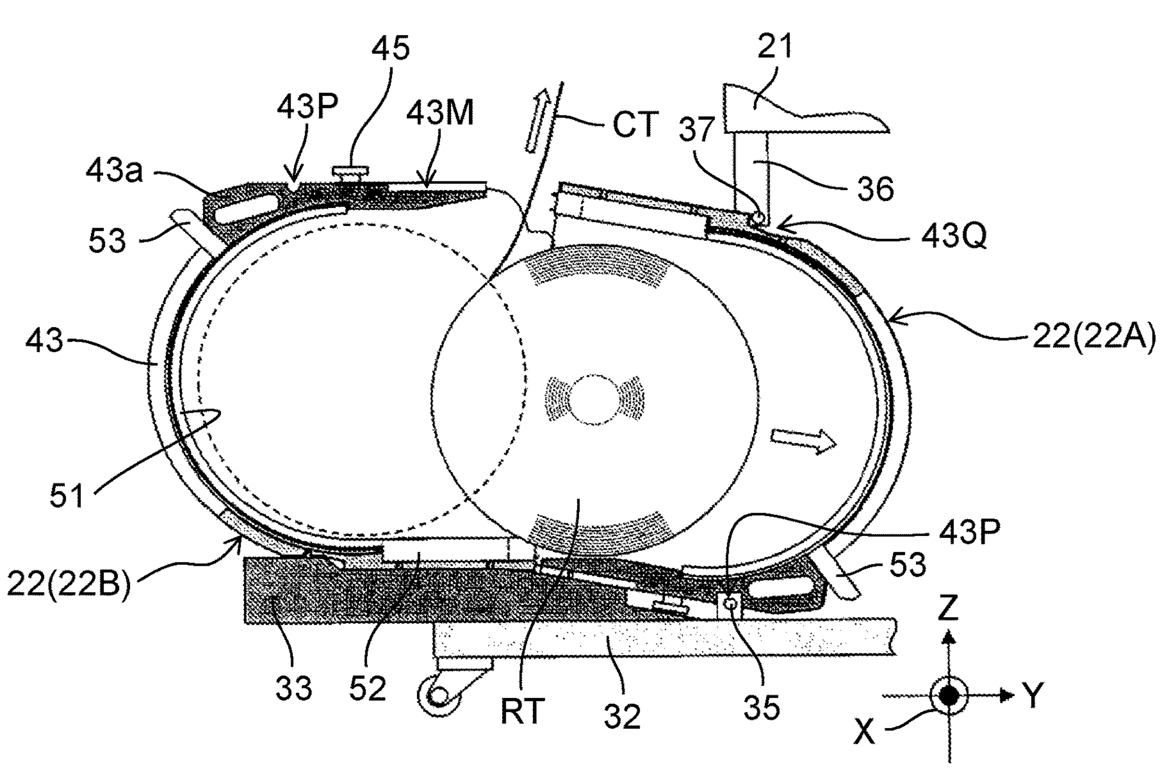
FIG. 21B is a side sectional view of a part of a component mounting device and illustrates a state of movement of a roll body according to an exemplary embodiment of the present disclosure.
Figure 22A:
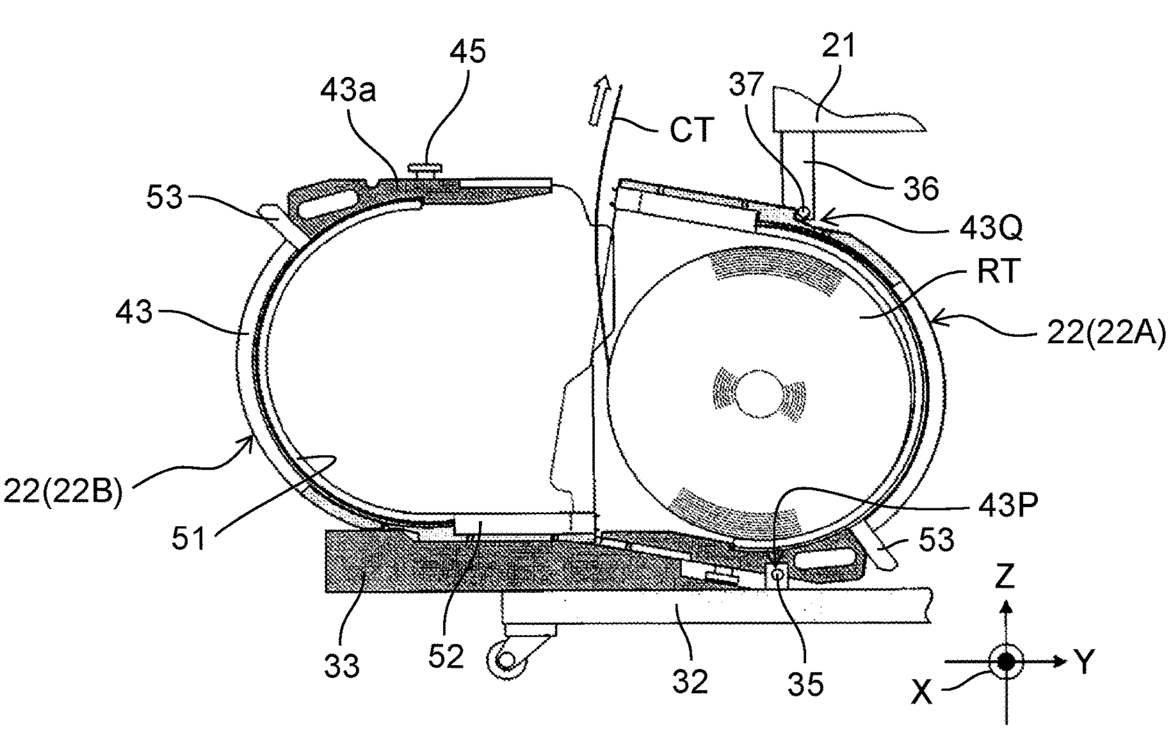
FIG. 22A is a side sectional view of a part of a component mounting device and illustrates a procedure for removing a tape cassette according to an exemplary embodiment of the present disclosure.
Figure 22B:
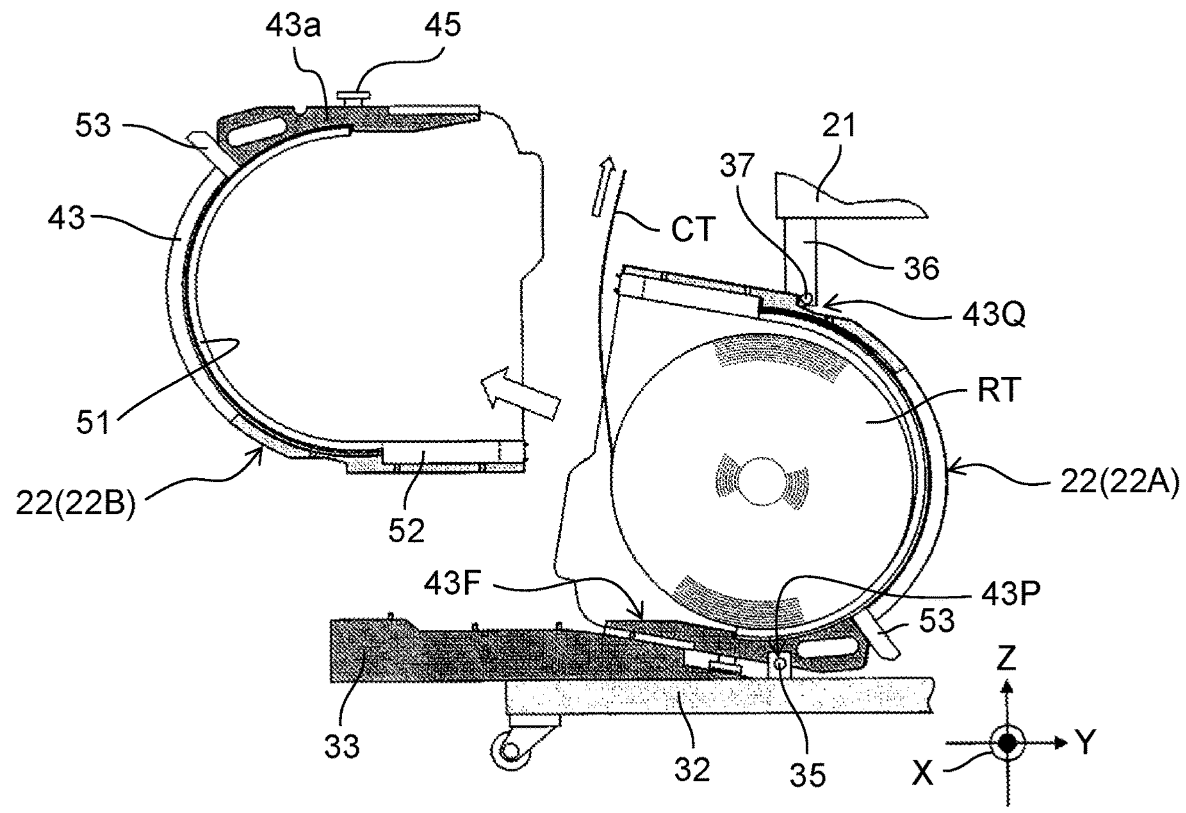
FIG. 22B is a side sectional view of a part of a component mounting device and illustrates a procedure for removing a tape cassette according to an exemplary embodiment of the present disclosure.

FIGS. 21A and 21B are each a side sectional view of a part of component mounting device 1T, illustrating a state of movement of roll body RT. FIGS. 22A and 22B are each a side sectional view of a part of component mounting device 1T, illustrating a procedure of removing tape cassette 22. Tape feeder 23 having drawn carrier tape CT in a process of equipping housing cassette 22B to housing cassette attaching unit 39 continuously conveys carrier tape CT to supply component BH when drawn carrier tape CT is a current tape. When drawn carrier tape CT is a replenishment tape, the refill tape is caused to stand by until detection of a tail part of the current tape, the tail part having passed through a predetermined position in tape feeder 23. When tape feeder 23 starts conveying the replenishment tape, roll body RT housed in housing cassette 22B is drawn by carrier tape CT conveyed by tape feeder 23 and is rolled forward, and then is moved into housing 41 of receiving cassette 22A positioned in front of roll body RT (FIG. 21A→FIG. 21B→FIG. 22A).

As described above, when roll body RT is moved from housing cassette 22B into receiving cassette 22A, roll body RT is guided by guide surface 43F of receiving cassette 22A. Then, the pair of side plates 44 of housing cassette 22B is positioned inside the pair of side plates 44 of receiving cassette 22A positioned in front of housing cassette 22B. Thus, roll body RT is smoothly moved into receiving cassette 22A and housed therein (FIG. 21B→FIG. 22A).

Figure 23A:
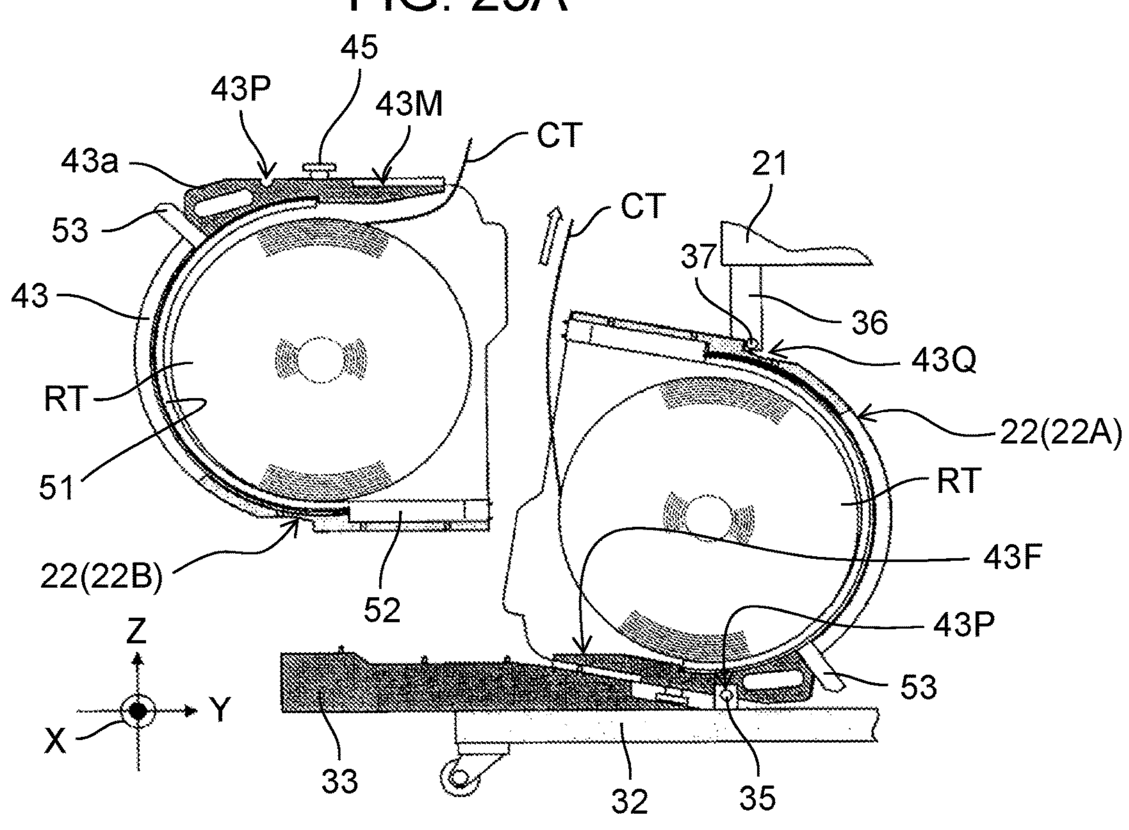
FIG. 23A is a side sectional view of a part of a component mounting device and illustrates a procedure for attaching a tape cassette according to an exemplary embodiment of the present disclosure.
Figure 23B:
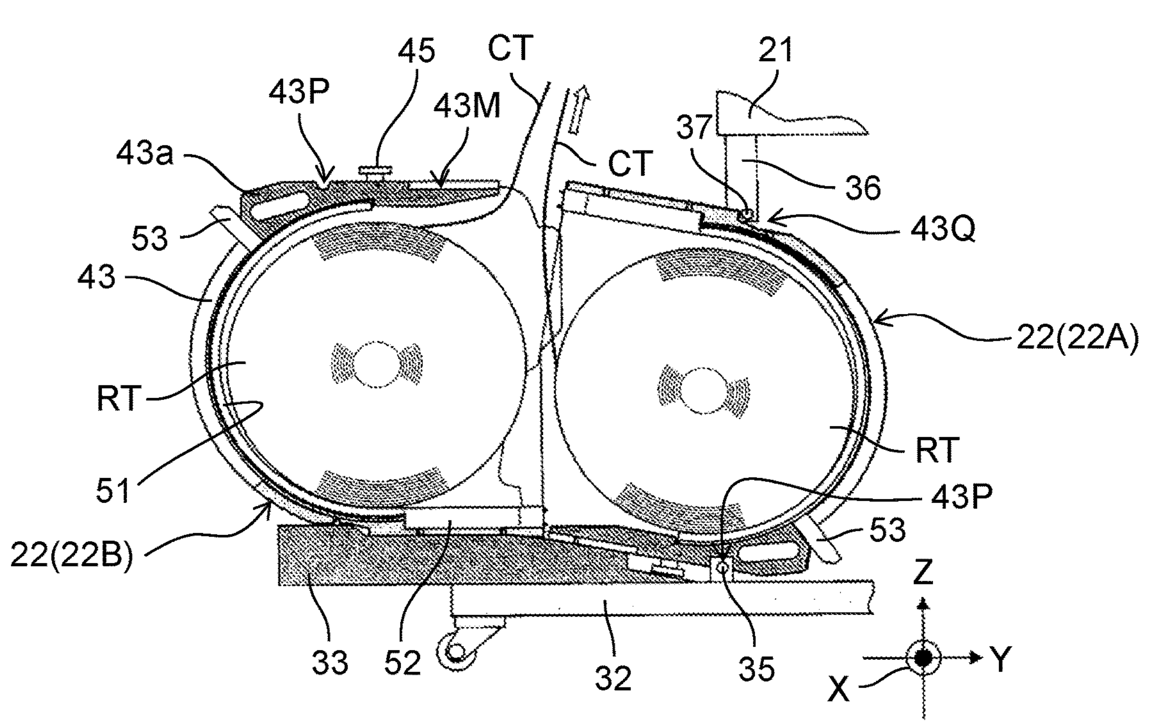
FIG. 23B is a side sectional view of a part of a component mounting device and illustrates a procedure for attaching a tape cassette according to an exemplary embodiment of the present disclosure.

FIGS. 23A and 23B are each a side sectional view of a part of component mounting device 1T, illustrating a procedure of attaching tape cassette 22. When roll body RT housed in housing cassette 22B is moved into receiving cassette 22A, housing cassette 22B becomes empty. Housing cassette 22B having become empty is removed from carriage 21 (cassette attaching unit 33) to equip roll body RT (housing cassette 22B) of a subsequent replenishment tape on carriage 21 (FIG. 22B). Then, when supply of component BH with tape feeder 23 progresses, the operator attaches new tape cassette 22 to cassette attaching unit 33 in the manner described above (FIG. 23A→FIG. 23B).

Figure 24A:
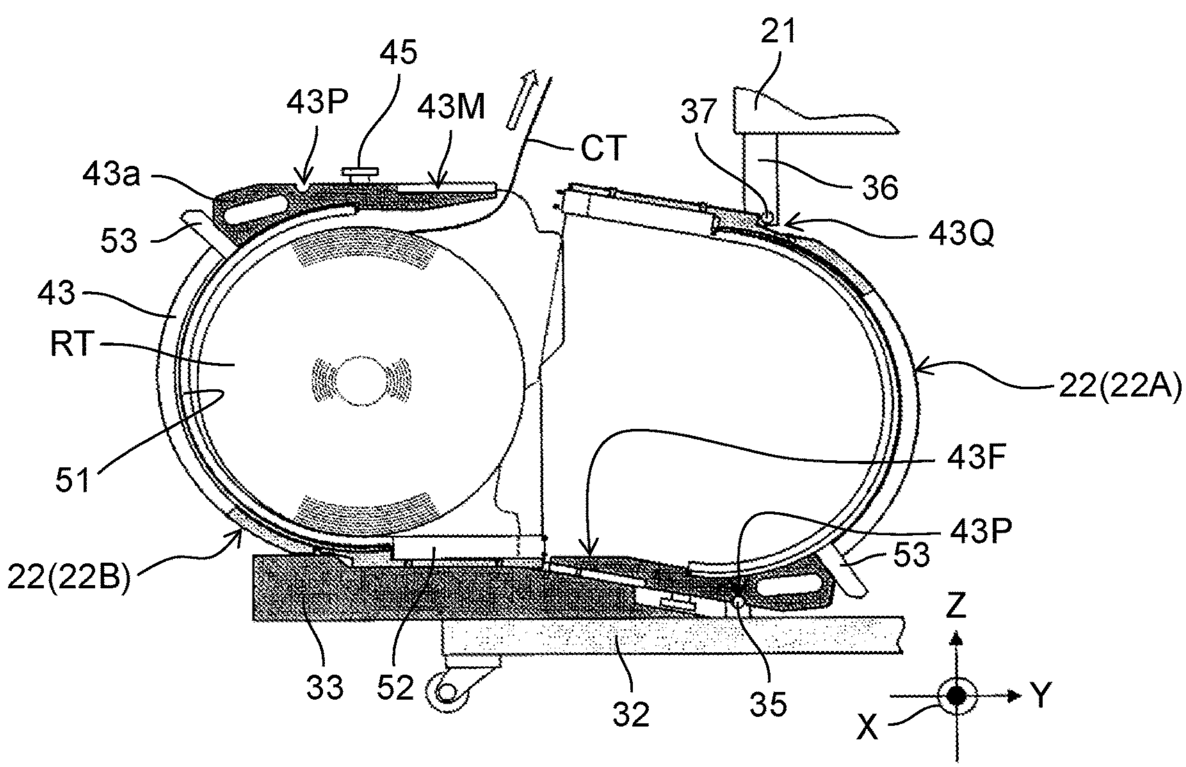
FIG. 24A is a side sectional view of a part of a component mounting device and illustrates a state of movement of a roll body according to an exemplary embodiment of the present disclosure.
Figure 24B:
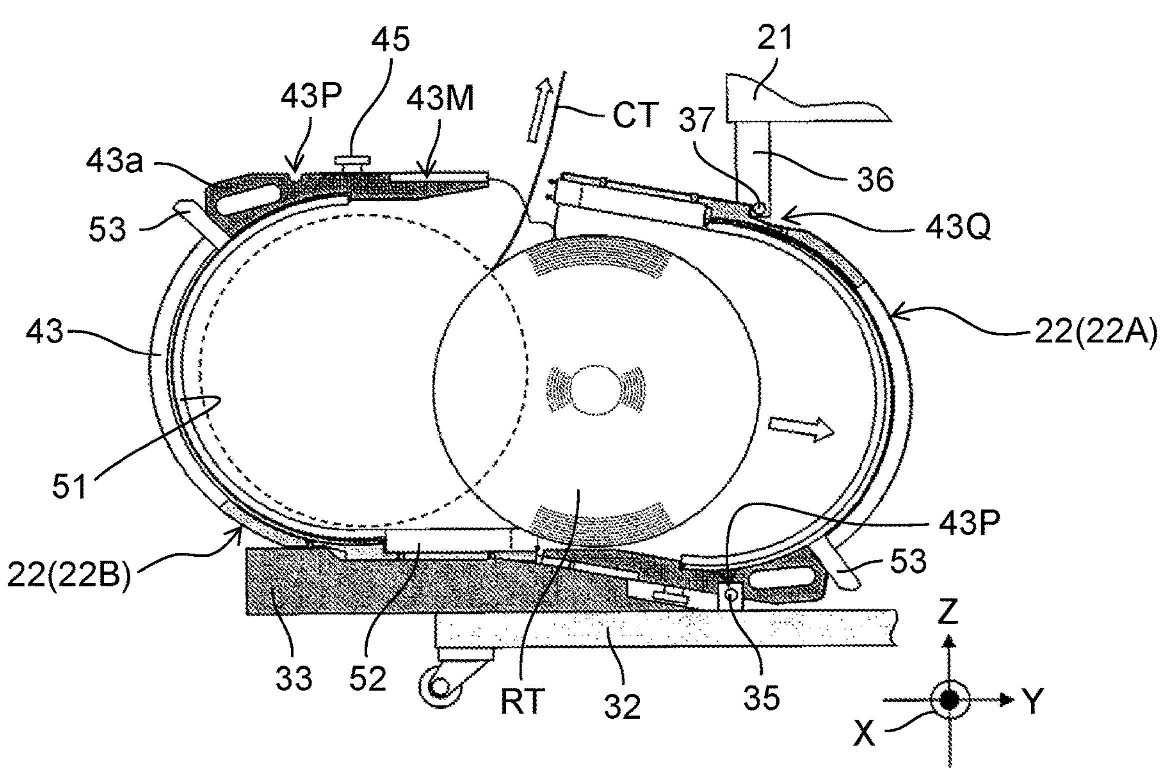
FIG. 24B is a side sectional view of a part of a component mounting device and illustrates a state of movement of a roll body according to an exemplary embodiment of the present disclosure.

FIGS. 24A and 24B are each a side sectional view of a part of component mounting device 1T, illustrating a state of movement of roll body RT. When conveyance of carrier tape CT with tape feeder 23 progresses to have detection of a tail part of carrier tape CT of roll body RT in receiving cassette 22A, the tail part having passed through a predetermined position in tape feeder 23, tape feeder 23 conveys the replenishment tape (carrier tape CT in housing cassette 22B) having been in a standby state as a new current tape (FIG. 24A) and continues the supply of component BH. When tape feeder 23 starts conveying carrier tape CT from roll body RT housed in housing cassette 22B, roll body RT of carrier tape CT is drawn and rolled forward to enter housing 41 of receiving cassette 22A equipped in front of roll body RT (FIG. 24A→FIG. 24B). As a result, housing cassette 22B becomes empty and is brought into the same state as in FIG. 22A described above, and thereafter, a process of FIG. 22A→FIG. 22B→FIG. 23A→FIG. 23B→FIG. 24A→FIG. 24B→FIG. 22A is repeated. Thus, component mounting device 1T can continue the supply of component BH with tape feeder 23 while receiving replenishment of roll body RT or carrier tape CT.

When component mounting device 1T finishes mounting the component, carrier tape CT having not been used up by component mounting device 1T and roll body RT may remain in receiving cassette 22A. Roll body RT with remaining carrier tape CT is stored or used in component mounting device 1T that produces another mount board. In this case, receiving cassette 22A is tape cassette 22 that can be used as housing cassette 22B, so that receiving cassette 22A housing roll body RT with remaining carrier tape CT can be directly stored after being removed from receiving cassette attaching unit 38. When used in component mounting device 1T, receiving cassette 22A removed is used as housing cassette 22B. In this case, receiving cassette 22A uses tape cassette 22 that is vertically inverted, so that roll body RT housed in receiving cassette 22A has a winding direction identical to a winding direction when roll body RT is used as housing cassette 22B. This configuration enables eliminating work of taking out roll body RT and storing roll body RT again after reversing a direction of roll body RT when receiving cassette 22A is used as housing cassette 22B.

As described above, tape cassette 22 (housing device) in the present exemplary embodiment supplies roll body RT of carrier tape CT housing component BH to component mounting device 1T, and includes housing 41 and shutter 42. Housing 41 includes housing space 41S for housing roll body RT and front opening 41K through which roll body RT can be taken in and out in the front part of housing 41. Shutter 42 can be displaced between the closing position (first position) at which movement of roll body RT to the outside of housing 41 through front opening 41K is restricted by blocking at least a part of front opening 41K and the open position (second position) at which the movement of roll body RT to the outside of housing 41 through front opening 41K is allowed. Then, tape cassette 22 as the housing device (housing cassette 22B) is equipped on carriage 21 while front opening 41K of housing 41 faces component mounting device 1T, and supplies roll body RT to component mounting device 1T with shutter 42 positioned at the open position.

Tape cassette 22 in the present exemplary embodiment prevents roll body RT housed in housing space 41S from jumping out to the outside of housing space 41S when shutter 42 is positioned at the closing position (first position). In contrast, when shutter 42 is positioned at the open position (second position), roll body RT housed can be taken out to the outside of housing space 41S. Thus, tape cassette 22 of the present exemplary embodiment enables roll body RT to be reliably supplied to component mounting device 1T while preventing roll body RT housed from unexpectedly jumping out.

Component mounting device 1T in the present exemplary embodiment also includes housing cassette attaching unit 39 (housing device attaching unit) to which housing cassette 22B (housing device) housing roll body RT of carrier tape CT (replenishment tape) is equipped, and receiving cassette attaching unit 38 (receiving unit attaching unit) to which receiving cassette 22A (receiving portion) that receives roll body RT supplied from housing cassette 22B equipped to housing cassette attaching unit 39 through front opening 41K is equipped. That is, component mounting device 1T in the present exemplary embodiment allows the housing device (housing cassette 22B) that houses roll body RT of a replenishment tape to be directly attached to carriage 21 instead of attachment to the housing device (receiving cassette 22A) that holds roll body RT of a current tape. Thus, component mounting device 1T in the present exemplary embodiment enables performing component mounting work by stably holding not only roll body RT small in size but also roll body RT large in size. That is, component mounting device 1T in the present exemplary embodiment can easily address increase in size of a roll body.

As described above, component mounting device 1T in the present exemplary embodiment can easily address increase in size of a roll body.

Although the exemplary embodiments of the present disclosure have been described above, the present disclosure is not limited to the above exemplary embodiments, and various modifications and the like can be made. For example, although shutter 42 of tape cassette 22 in the exemplary embodiment described above has a J shape as a whole, the shape of shutter 42 is not limited to the J shape as long as shutter 42 can be displaced between the closing position (first position) for closing front opening 41K of housing 41 and the open position (second position) for opening front opening 41K.

INDUSTRIAL APPLICABILITY

A component mounting device capable of addressing increase in size of a roll body can be provided.

REFERENCE MARKS IN THE DRAWINGS

1T component mounting device
13 mounting head
22 tape cassette
22A receiving cassette
22B housing cassette (housing device)
23 tape feeder (component supply unit)
33P housing cassette holding pin (positioning part)
38 receiving cassette attaching unit (receiving unit attaching unit)
39 housing cassette attaching unit (housing device attaching unit)
41 housing
41K front opening (opening)
41S housing space
42 shutter (restriction part)
43 frame
43g shutter guiding part (guiding part)
43S pin insertion part (engaged part)
43U main attachment part (attachment part)
43R sub-attachment unit
44 side plate (plate member)
51 slider
52 shutter leading end part (leading end part)
53 operation lever
54 tape holder
55 tape locking protrusion (feed hole engagement part)
CT carrier tape
SH feed hole
RT roll body
CJ center axis line
BH component

What is claimed is:

1. A component mounting device configured to pick up a component from a carrier tape housing the component and mount the component on a board, the component mounting device comprising:
- a mounting head that picks up the component and mounts the component on the board;
- a housing cassette including a first housing space for housing a roll body of the carrier tape, the housing cassette further including a first opening allowing the roll body to be taken in and out through the first opening, the first opening being provided in a front part of the housing cassette;
- a housing cassette attaching unit to which the housing cassette is equipped;
- a receiving cassette including a second housing space for housing the roll body of the carrier tape, the receiving cassette further including a second opening allowing the roll body to be taken in and out through the second opening, the receiving cassette housing the roll body supplied from the housing cassette equipped in the housing cassette attaching unit, the second opening being provided in a front part of the receiving cassette;
- a receiving cassette attaching unit to which the receiving cassette is equipped; and
- a component supply unit that draws the carrier tape from the roll body of the receiving cassette equipped in the receiving cassette attaching unit to supply the component to the mounting head and that draws the carrier tape from the roll body of the housing cassette equipped in the housing cassette attaching unit following the carrier tape, wherein the housing cassette includes:
- a housing provided with the first housing space for housing the roll body and the first opening, and
- a first restriction part that is displaced between a first position and a second position, the first position being a position at which movement of the roll body to an outside of the first housing space through the first opening is restricted by blocking at least a part of the first opening, the second position being a position at which the movement of the roll body to the outside of the first housing space through the first opening is allowed.

2. The component mounting device according to claim 1, wherein
- the receiving cassette attaching unit equips the receiving cassette with the second opening facing the housing cassette attaching unit, and
- the housing cassette attaching unit equips the housing cassette with the first opening facing the receiving cassette equipped on the receiving cassette attaching unit.

3. The component mounting device according to claim 1, wherein the housing cassette attaching unit equips the housing cassette with the first opening that is at least partly inserted into the second opening of the receiving cassette.

4. The component mounting device according to claim 1, wherein the receiving cassette attaching unit equips the receiving cassette at a position lower than the housing cassette equipped on the housing cassette attaching unit.

5. The component mounting device according to claim 1, wherein the receiving cassette attaching unit equips the receiving cassette in an inclined attitude in which the receiving cassette decreases in height with distance from the housing cassette attaching unit.

6. The component mounting device according to claim 1, wherein the housing cassette and the receiving cassette are tape cassettes identical in structure.

7. The component mounting device according to claim 6, wherein the receiving cassette attaching unit equips corresponding one of the tape cassettes in a vertically inverted attitude.

8. The component mounting device according to claim 1, wherein
- the receiving cassette includes a second restriction part that is displaced between a third position and a fourth position, the third position being a position at which movement of the roll body to the outside of the second housing space through the second opening is restricted by blocking at least a part of the second opening, the fourth position being a position at which the movement of the roll body to the outside of the second housing space through the second opening is allowed, and
- the second restriction part of the receiving cassette equipped on the receiving cassette attaching unit is positioned at the fourth position, and the first restriction part of the housing cassette equipped on the housing cassette attaching unit is positioned at the first position.

9. The component mounting device according to claim 1, further comprising:
- a component mounting device body including the mounting head; and
- a carriage that is attached to and detached from the component mounting device body, wherein the housing cassette attaching unit and the receiving cassette attaching unit are provided on the carriage.

* * * * *